(12) United States Patent
  Lu

(10) Patent No.: US 9,831,195 B1
(45) Date of Patent: Nov. 28, 2017

(54) SEMICONDUCTOR PACKAGE STRUCTURE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/338,176

(22) Filed: Oct. 28, 2016

(51) Int. Cl.
| | |
|---|---|
| H01L 23/18 | (2006.01) |
| H01L 23/00 | (2006.01) |
| H01L 23/498 | (2006.01) |
| H01L 23/31 | (2006.01) |
| H01L 25/10 | (2006.01) |
| H01L 21/48 | (2006.01) |
| H01L 21/54 | (2006.01) |
| H01L 21/56 | (2006.01) |
| H01L 25/00 | (2006.01) |

(52) U.S. Cl.
CPC ........ *H01L 23/562* (2013.01); *H01L 21/4853* (2013.01); *H01L 21/4857* (2013.01); *H01L 21/54* (2013.01); *H01L 21/565* (2013.01); *H01L 23/18* (2013.01); *H01L 23/3114* (2013.01); *H01L 23/49822* (2013.01); *H01L 23/49838* (2013.01); *H01L 24/08* (2013.01); *H01L 25/105* (2013.01); *H01L 25/50* (2013.01); *H01L 2224/16227* (2013.01); *H01L 2225/1041* (2013.01); *H01L 2225/1058* (2013.01); *H01L 2924/3511* (2013.01)

(58) Field of Classification Search
CPC ..... H01L 2924/181; H01L 2224/32145; H01L 21/568; H01L 21/563; H01L 21/4857; H01L 23/3121; H01L 24/03; H01L 24/13; H01L 24/16; H01L 23/49827; H01L 25/0657; H01L 23/5389; H01L 2224/16145
See application file for complete search history.

(56) References Cited

U.S. PATENT DOCUMENTS

| | | |
|---|---|---|
| 6,284,569 B1 | 9/2001 | Sheppard et al. |
| 7,902,650 B2 | 3/2011 | Hu et al. |
| 2011/0304015 A1* | 12/2011 | Kim ...................... H01L 23/552 257/532 |

(Continued)

*Primary Examiner* — Roy Potter
(74) *Attorney, Agent, or Firm* — Foley & Lardner LLP; Cliff Z. Liu

(57) ABSTRACT

Various embodiments relate to a semiconductor package structure. The semiconductor package structure includes a first chip having a first surface and a second surface opposite the first surface. The semiconductor package structure further includes a supporter surrounding an edge of the first chip. The semiconductor package structure further includes a conductive layer disposed over the first surface of the first chip and electrically connected to the first chip. The semiconductor package structure further includes an insulation layer disposed over the first surface of the first chip, wherein the insulation layer extends toward and overlaps the supporter in a vertical projection direction. The semiconductor package structure further includes an encapsulant between the first chip and the supporter and surrounding at least the edge of the first chip.

20 Claims, 40 Drawing Sheets

(56) References Cited

U.S. PATENT DOCUMENTS

2012/0080787 A1\* 4/2012 Shah .................. H01L 21/4853
 257/737
2015/0214074 A1 7/2015 Liu et al.

\* cited by examiner

SEMICONDUCTOR PACKAGE STRUCTURE AND METHOD OF MANUFACTURING THE SAME

BACKGROUND

1. Technical Field

The present disclosure relates to a semiconductor package structure and method of manufacturing the same, and more particularly, to a semiconductor package structure having an insulation layer overlapping a supporter in a vertical projection direction and a method of manufacturing the same.

2. Description of the Related Art

Due to demand for high performance and high density semiconductor packages, a semiconductor package structure is designed to have high density input and output (I/O) counts and a thinner thickness. Generally, the conventional semiconductor package has an asymmetrical structure due to its thin thickness design, and is formed on a caIndents Corrected tif 1 Thank you :D YRrrier in association with an interposer having through silicon vias (TSVs) to meet high density requirements.

The conventional semiconductor package structure, however, is subject to warpage issues due to its asymmetrical structure, and differences in coefficient of thermal expansions (CTEs) among its different material layers. In addition, the use of the interposer and the permanent carrier increases manufacturing cost and makes it difficult to further reduce thickness of the conventional semiconductor package structure.

SUMMARY

In one or more embodiments, a semiconductor package structure includes a first chip, a supporter, a conductive layer, an insulation layer and an encapsulant. The first chip has a first surface and a second surface opposite the first surface. The supporter surrounds an edge of the first chip. The conductive layer is disposed over the first surface of the first chip and is electrically connected to the first chip. The insulation layer is disposed over the first surface of the first chip, and the insulation layer extends toward and overlaps the supporter in a vertical projection direction. The encapsulant is between the first chip and the supporter, and surrounds at least the edge of the chip.

In one or more embodiments, a semiconductor package structure includes a first chip, a supporter, a conductive layer, an insulation layer and an encapsulant. The first chip has a first surface and a second surface opposite the first surface. The supporter surrounds an edge of the first chip. The conductive layer is disposed over the first surface of the first chip and is electrically connected to the first chip. The insulation layer is disposed over the first surface of the first chip. The insulation layer includes a first portion and a second portion connected to the first portion, the first portion overlaps the first chip in a vertical projection direction, the second portion overlaps the supporter in the vertical projection direction, and the first portion and the second portion are disposed at different horizontal levels. The encapsulant is between the first chip and the supporter, and surrounds at least the edge of the first chip.

In one or more embodiments, a method for manufacturing a semiconductor package structure includes forming a supporter over a temporary carrier, and disposing a chip over the temporary carrier wherein a first surface of the chip faces the temporary carrier. The method further includes forming an encapsulant covering the supporter and a second surface of the chip, and removing the temporary carrier from the supporter and the chip.

BRIEF DESCRIPTION OF THE DRAWINGS

Aspects of the present disclosure are best understood from the following detailed description when read with the accompanying figures. It is noted that various structures may not be drawn to scale, and the dimensions of the various structures may be arbitrarily increased or reduced for clarity of discussion.

DETAILED DESCRIPTION

Figure 1:
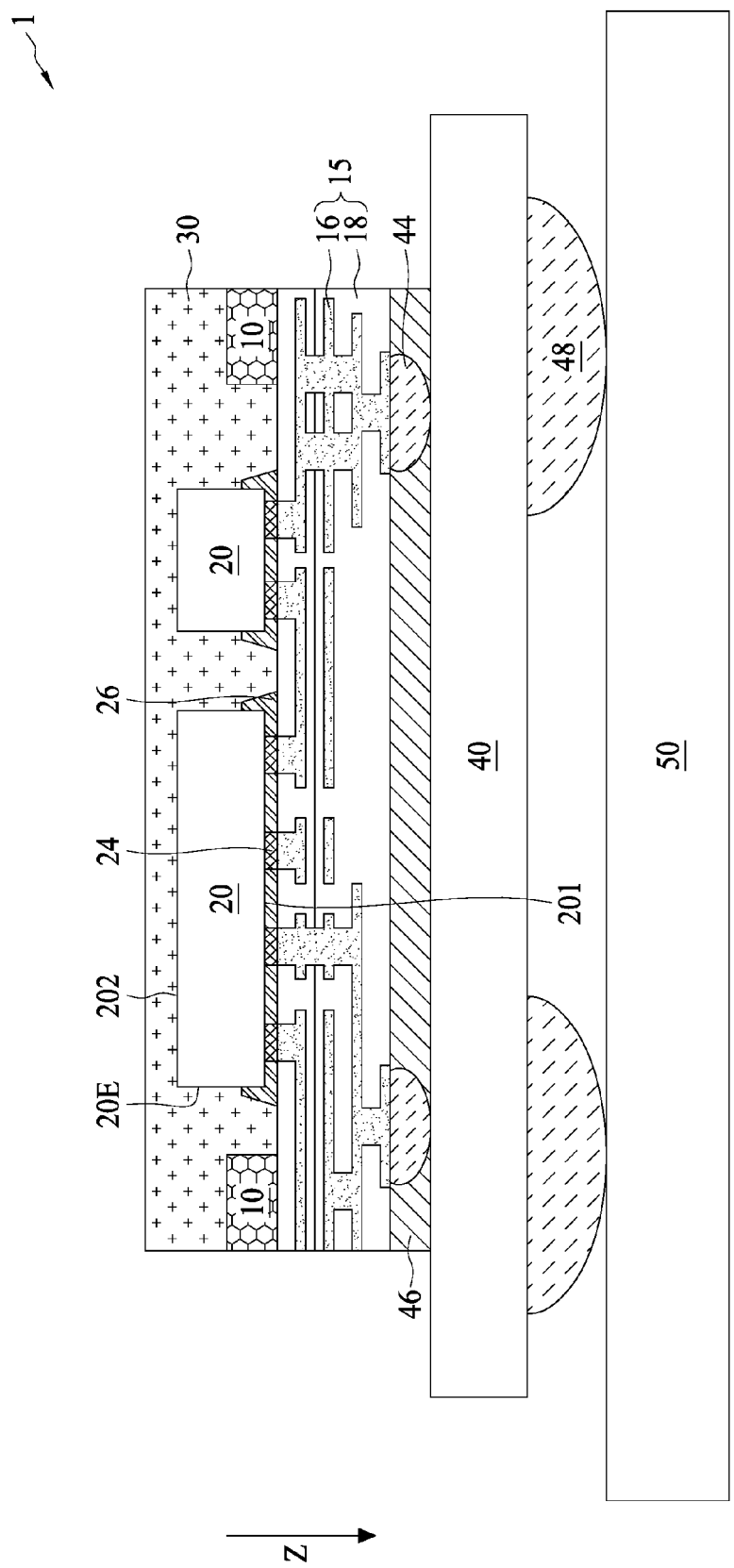
FIG. 1 is a cross-sectional view of a semiconductor package structure in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "over", "above", "upper", "on" and the like, may be used herein for ease of description to describe one component or feature's relationship to another component(s) or feature(s) as illustrated in the figures. The present disclosure is intended to encompass different orientations of the device in use or operation in addition to the orientation depicted in the figures. The apparatus may be otherwise oriented (e.g., rotated 90 degrees or at other orientations) and the spatially relative descriptors used herein may likewise be interpreted accordingly.

The following description is directed to a semiconductor package structure. The semiconductor package structure includes chip(s) encapsulated therein. The chip(s) may be one of various types of chips such as an optoelectronic chip, a semiconductor chip, an electronic chip or a micro electromechanical system (MEMS) chip.

The following description is also directed to a method of manufacturing a semiconductor package structure. In some embodiments, the manufacturing method uses a temporary carrier as a base to form a supporter, a chip and an encapsulant. The encapsulant covers the supporter, thereby forming a structure with sufficient mechanical strength to hold the chip. Accordingly, the temporary carrier can be removed and therefore the thickness of the semiconductor package structure can be reduced.

FIG. 1 is a cross-sectional view of a semiconductor package structure 1 in accordance with some embodiments of the present disclosure. As shown in FIG. 1, the semiconductor package structure 1 includes one or more chips (e.g., one or more first chips) 20, one or more supporters 10, a conductive layer 16, an insulation layer 18 and an encapsulant 30. The chip 20 has a first surface 201 and a second surface 202 opposite the first surface 201. In one or more embodiments, the chip 20 may include an application specific integrated circuit (ASIC) chip, a memory chip or any other suitable active device or passive device chip. The supporter 10 surrounds an edge 20E of the chip 20. The supporter 10 may be a rigid supporter or a soft supporter. The material for the rigid supporter may be a conductive material including metal or alloy such as copper, nickel, gold, silver or stainless steel, an insulation material such as silicon, glass, ceramics or organic material, or any other suitable material. The material for the soft supporter may be rubber, thermoplastic material, thermoelastic material, or any other suitable material. The supporter 10 is configured as a stiffener to provide mechanical robustness.

The conductive layer 16 is disposed over the first surface 201 of the chip 20 and is electrically connected to the chip 20. The insulation layer 18 is disposed over the first surface 201 of the chip 20. The insulation layer 18 extends toward and overlaps the supporter 10 in a vertical projection direction Z. In one or more embodiments, the conductive layer 16 is embedded in the insulation layer 18, forming a redistribution layer (RDL) 15. For example, the conductive layer 16 includes one or more layers of conductive patterns, and the insulation layer 18 includes one or more layers of insulation film. The topmost layer and bottommost layer of the conductive patterns are exposed from opposite sides of the RDL 15.

The encapsulant 30 is disposed between the chip 20 and the supporter 10, and the encapsulant 30 surrounds at least the edge 20E of the chip 20. In one or more embodiments, the encapsulant 30 covers the second surface 202 of the chip 20 and the supporter 10. The encapsulant 30, the supporter 10 and the insulation layer 18 may be bonded to one another to enhance the robustness of the semiconductor package structure 1, and thus no carrier or interposer may be used. Accordingly, a thickness of the semiconductor package structure 1 can be reduced.

In one or more embodiments, the semiconductor package structure 1 further includes one or more conductors (e.g., one or more first conductors) 24 formed between the first surface 201 of the chip 20 and the conductive layer 16. The chip 20 and the conductive layer 16 are electrically connected to each other through the conductors 24. In one or more embodiments, the conductors 24 may include contact pads, and an underfill layer 26 may be filled between the chip 20 and the RDL 15. In one or more embodiments, the underfill layer 26 may be replaced with an adhesive layer formed by gel dispensing.

In one or more embodiments, the semiconductor package structure 1 further includes a package substrate 40 and one or more second conductors 44 disposed between the insulation layer 18 and the package substrate 40. The conductive layer 16 and the package substrate 40 are electrically connected through the second conductors 44. The package substrate 40 may include internal conductors formed therein. The second conductors 44 may be, but are not limited to, solder bumps surrounded by an underfill layer 46.

In one or more embodiments, the semiconductor package structure 1 further includes a circuit board 50 and one or more third conductors 48 formed between the package substrate 40 and the circuit board 50. The package substrate 40 and the circuit board 50 are electrically connected through the third conductors 48. The circuit board 50 may include circuitry formed therein. The third conductors 48 may be, but are not limited to, solder bumps such as C4 bumps. In one or more embodiments, the package substrate 40 and the circuit board 50 may be electrically connected by land grid array (LGA) bonding, ball grid array (BGA) bonding or any other suitable bonding technique.

The encapsulant 30, the supporter 10 and the insulation layer 18 may be bonded to one another to enhance the robustness of the semiconductor package structure 1, and thus no carrier or interposer may be used. Accordingly, the thickness of the semiconductor package structure 1 can be reduced, and warpage of the semiconductor package structure 1 can be alleviated. In addition, the insulation layer 18 or the encapsulant 30 may be partially fixed on the supporter 10, and thus a surface wrinkle may be mitigated.

Figure 2A:
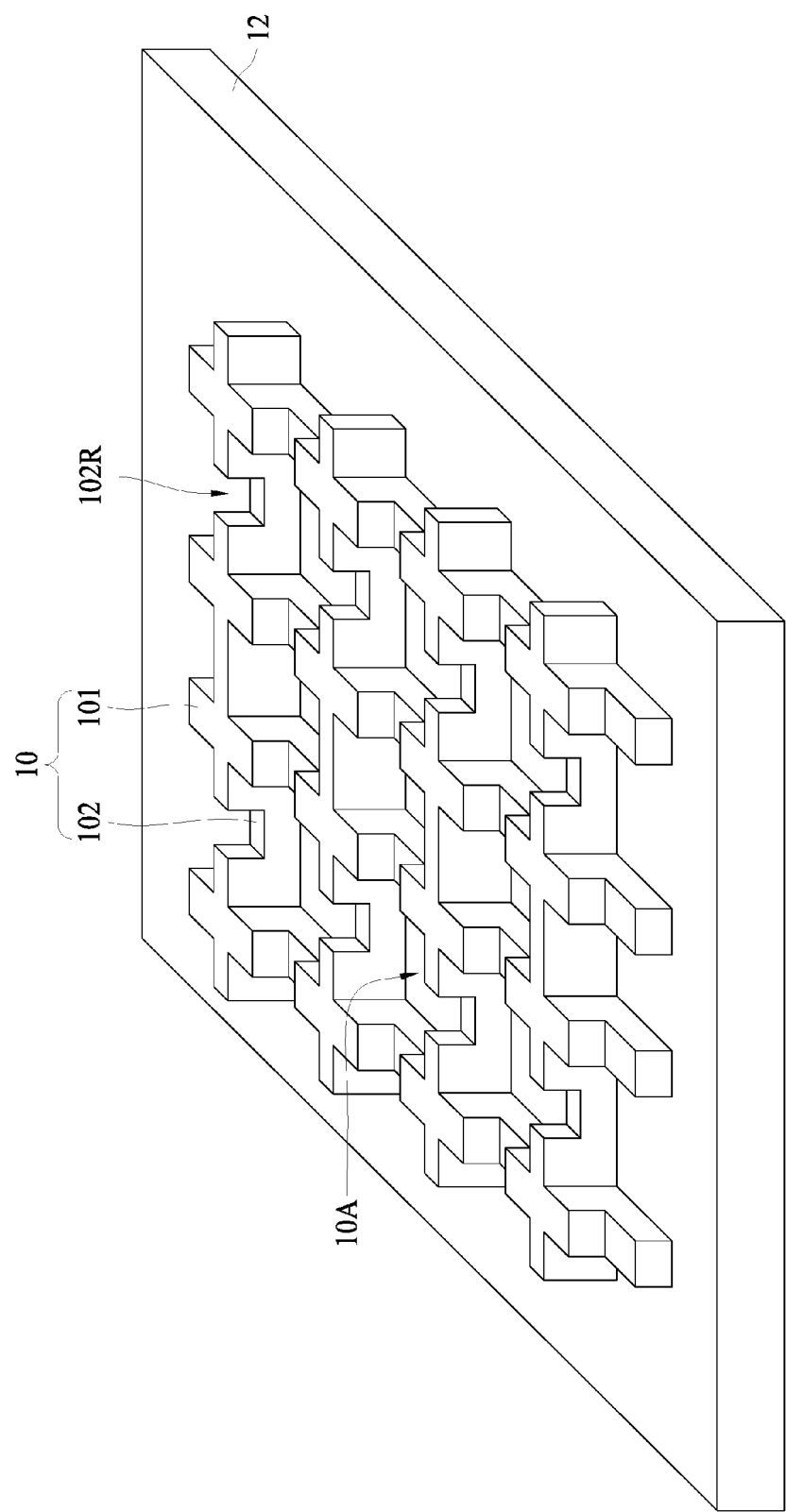
FIG. 2A, FIG. 2B, FIG. 2C, FIG. 2D, FIG. 2E, FIG. 2F, FIG. 2G and FIG. 2H illustrate a method of manufacturing a semiconductor package structure in accordance with some embodiments of the present disclosure.
Figure 2B:
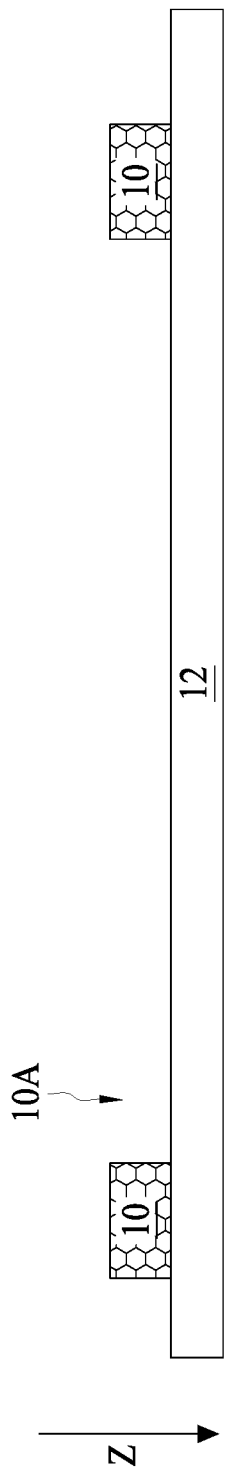

FIG. 2A, FIG. 2B, FIG. 2C, FIG. 2D, FIG. 2E, FIG. 2F, FIG. 2G and FIG. 2H illustrate a method of manufacturing a semiconductor package structure in accordance with some embodiments of the present disclosure. It is appreciated that the method may be a wafer-level manufacturing method, and one semiconductor package structure is illustrated for clarity of discussion. The supporter 10 is formed over a temporary carrier 12 as shown in FIGS. 2A and 2B, where FIG. 2A is a perspective view and FIG. 2B is a partial cross-sectional side view of FIG. 2A. In one or more embodiments, the temporary carrier 12 is a single-layered film, and the material of the temporary carrier 12 includes a conductive material such as copper or nickel, or insulative material such as a dielectric material under a designation of TMMR. In one or more embodiments, the temporary carrier 12 has a rectangular shape as depicted in FIG. 2B. The supporter 10 may be, but is not limited to, a silicon supporter. The supporter 10 may have a grid pattern, defining one or more cavities 10A for accommodating chips. In one or more embodiments, the supporter 10 includes a first segment 101 and a second segment 102 connected to each other, and a thickness of the second segment 102 is smaller than a thickness of the first segment 101. The second segment 102 has a recessed portion 102R recessed from an upper surface of the supporter 10.

Figure 2C:
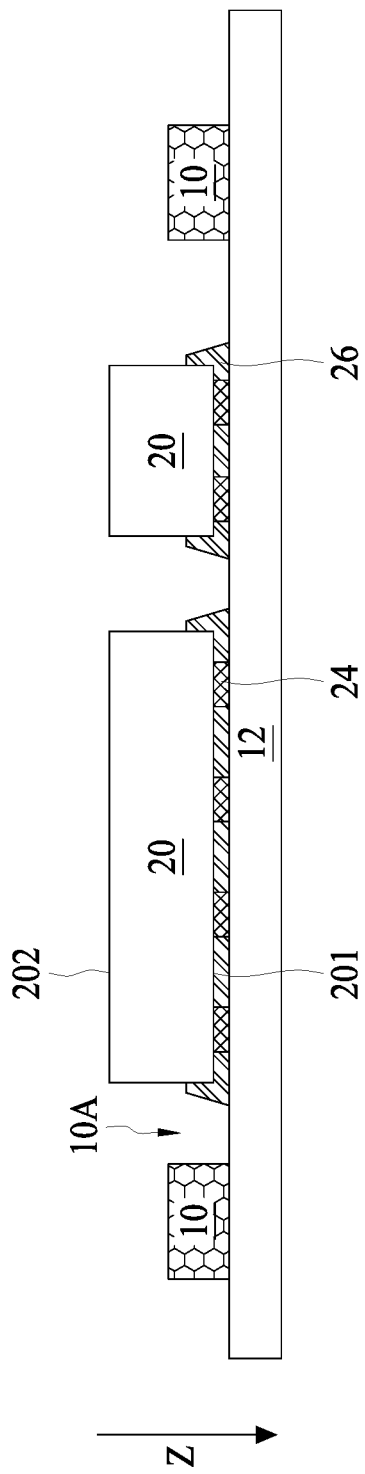

Referring to FIG. 2C, the chips 20 are disposed over the temporary carrier 12 and in the cavities 10A defined by the supporter 10. The chip 20 has the first surface 201 facing the temporary carrier 12, and the second surface 202 facing away from the temporary carrier 12. In one or more embodiments, the chip 20 includes the conductors 24 such as contact pads formed on the first surface 201, and the underfill layer 26 is dispensed between the chip 20 and the temporary carrier 12, the underfill layer 26 surrounding the conductors 24.

Figure 2D:
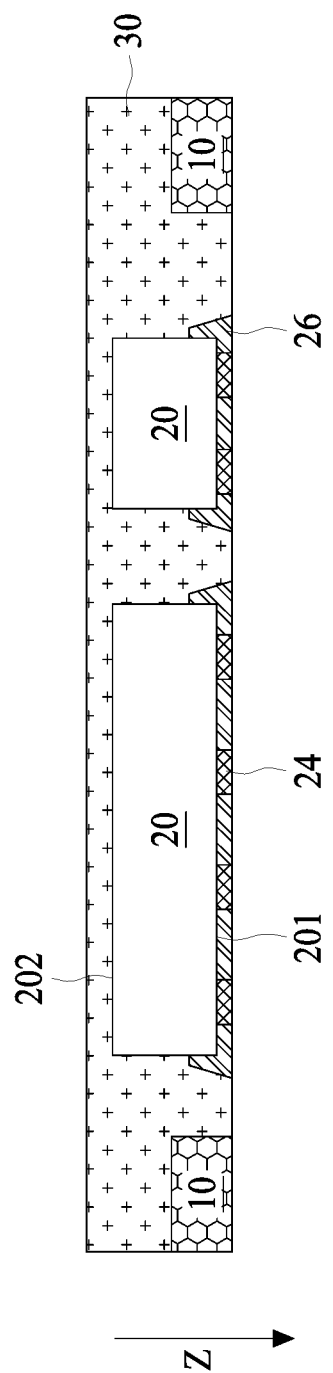

Referring to FIG. 2D, the encapsulant 30 is formed, covering the supporter 10 and the second surface 202 of the chip 20. In one or more embodiments, the encapsulant 30 is formed by molding, and the recessed portion 102R of the second segment 102 (as shown in FIG. 2A) allows the molding material to flow between the spaces defined by the supporter 10. Subsequently, the molding material can be thermally and/or optically cured to form the encapsulant 30. The encapsulant 30 covers and engages with the supporter 10, thereby forming a structure with sufficient mechanical strength to hold the chip 20. Accordingly, the temporary carrier 12 can be removed from the supporter 10 and the chip 20 by, for example, etching, prying off, or any other suitable methods.

Figure 2E:
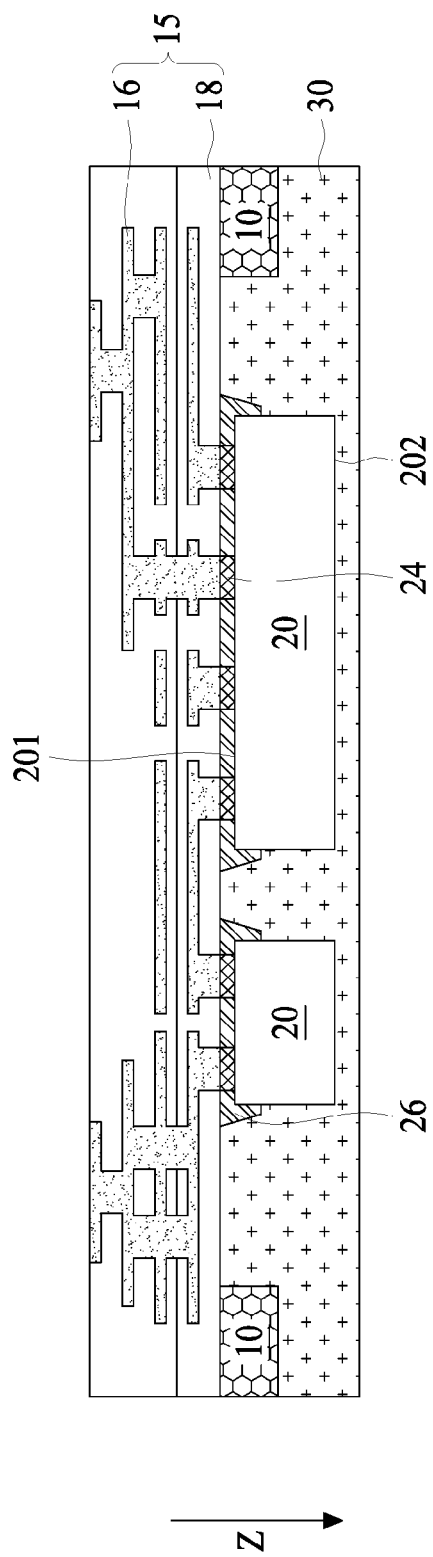

Referring to FIG. 2E, subsequent to the removal of the temporary carrier 12 from the supporter 10 and the chip 20, the chip 20 is flipped over, and the conductive layer 16 and the insulation layer 18 are formed over the first surface 201 of the chip 20 and the supporter 10. In one or more embodiments, the insulation layer 18 extends toward and overlaps the supporter 10 in the vertical projection direction Z. The conductive layer 16 is embedded in the insulation layer 18, forming the RDL 15. In one or more embodiment, the RDL 15 may be formed by stacking a number of insulation films and conductive patterns. The bottommost layer and the topmost layer of the conductive patterns are exposed from the insulation layer 18, where one of the bottommost layer and the topmost layer of the conductive patterns is electrically connected to the conductors 24 of the chip 20, and the other one of the bottommost layer and the topmost layer of the conductive patterns is electrically connected to another electronic device to be formed.

Figure 2F:
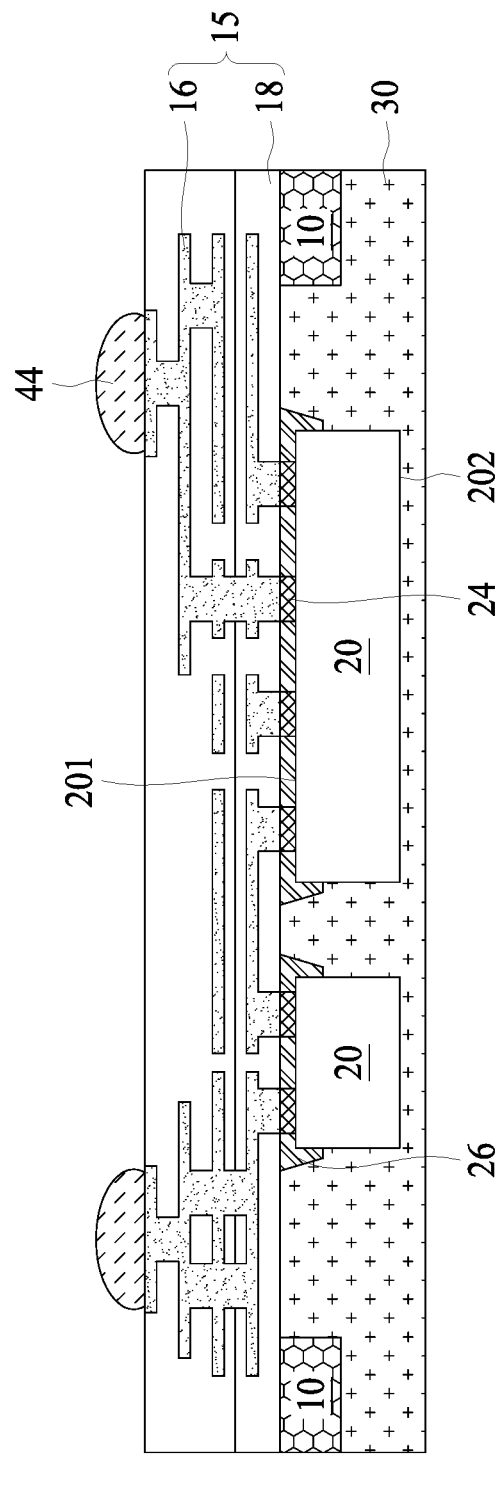
Figure 2G:
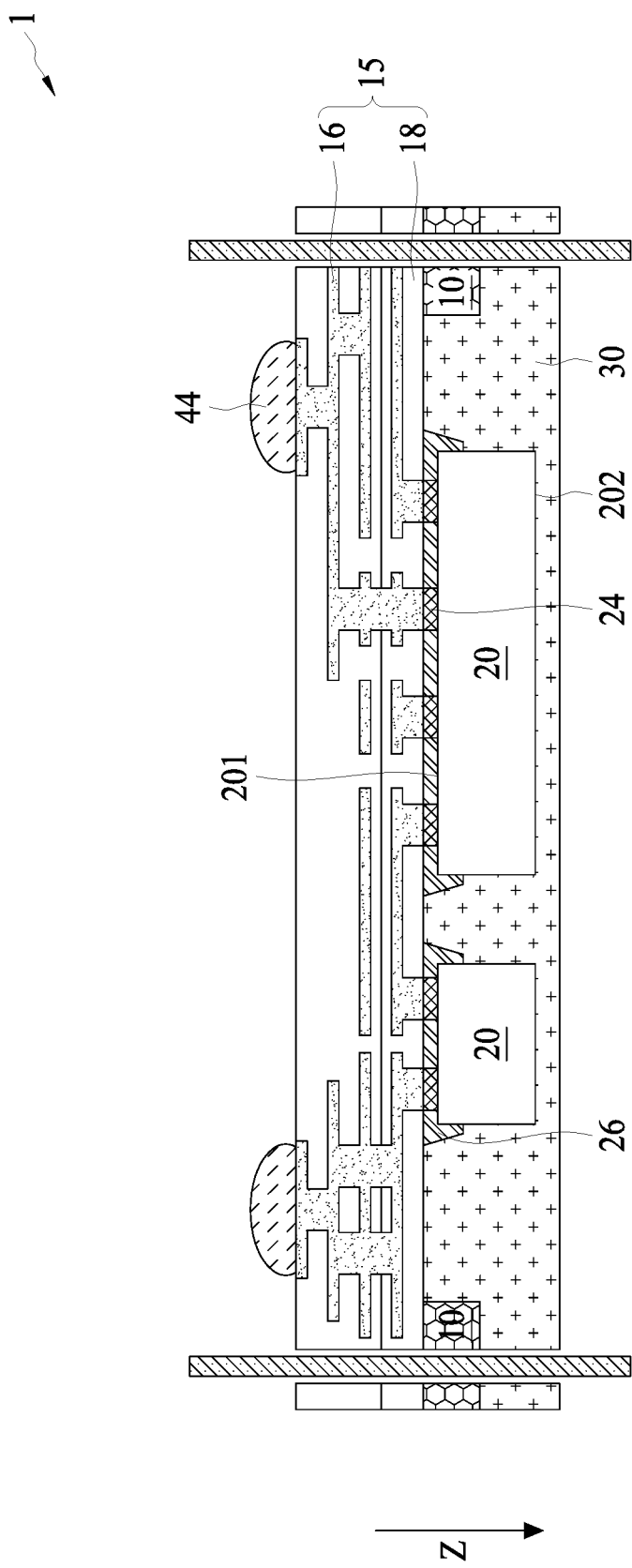
Figure 2H:
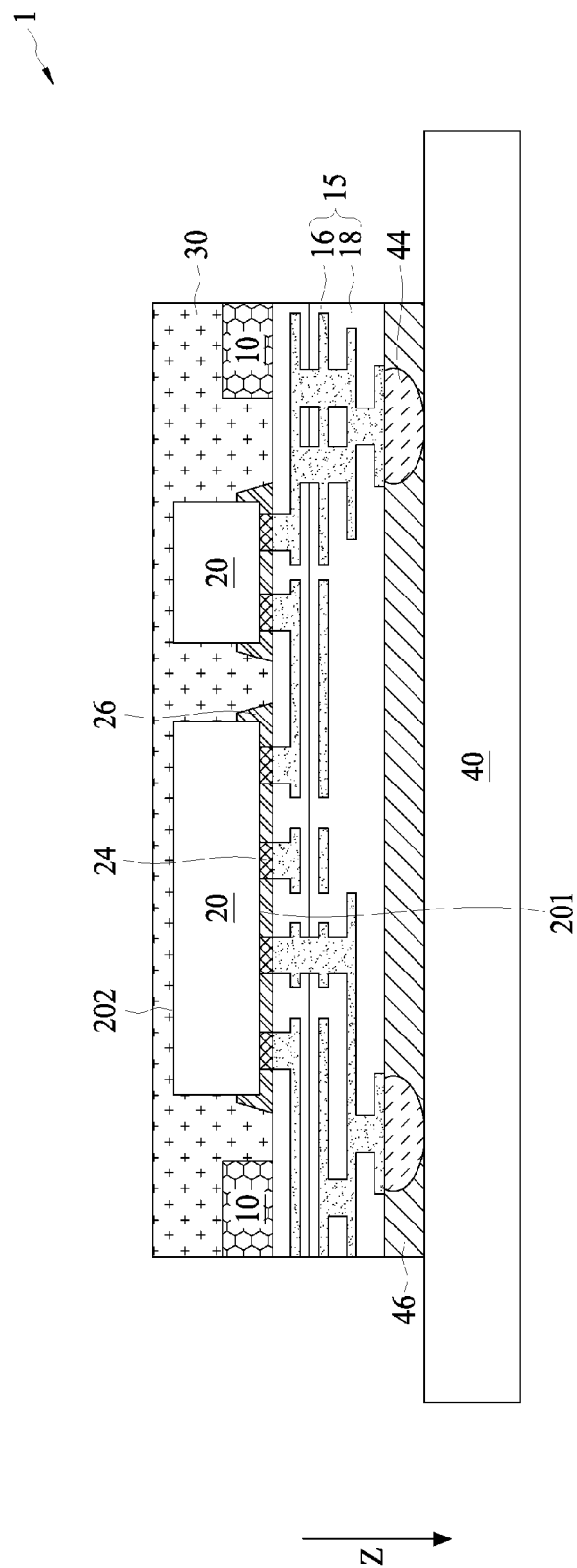

Referring to FIG. 2F, the second conductors 44 are formed over the RDL 15. In one or more embodiments, the second conductors 44 are solder bumps such as C4 bumps, but not limited thereto. Referring to FIG. 2G, a singulation process is carried out by, for example blade cutting, etching or laser cutting, to form a plurality of semiconductor package structures 1. Referring to FIG. 2H, the semiconductor package structure 1 is electrically connected to the package substrate 40 via the second conductors 44. The underfill layer 46 may be filled between the RDL 15 and the package substrate 40 to surround and protect the second conductors 44.

Subsequently, in one or more embodiments, the third conductors 48 are formed on the package substrate 40. The third conductors 48 may be, but are not limited to, solder bumps. The package substrate 40 may be electrically connected to the circuit board 50 through the third conductors 48 to form the semiconductor package structure 1 as illustrated in FIG. 1.

The semiconductor package structure and manufacturing method of the present disclosure are not limited to the above-mentioned embodiments, and may have other different embodiments. To simplify the description and for the convenience of comparison between each of the embodiments of the present disclosure, the same components in each of the following embodiments are marked with same numerals.

Figure 3:
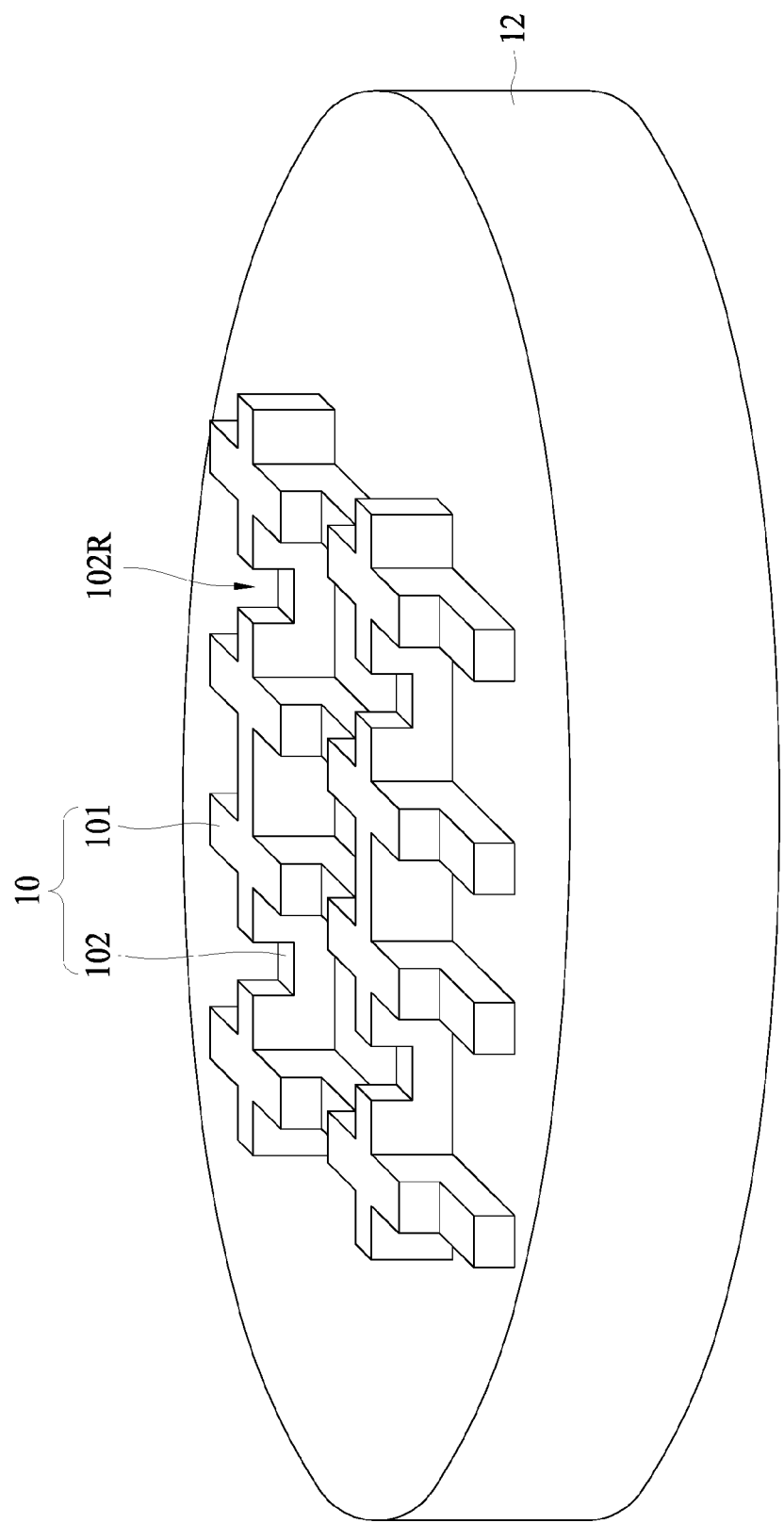
FIG. 3 is a schematic diagram illustrating a temporary carrier and a supporter in accordance with some embodiments of the present disclosure.

FIG. 3 is a schematic diagram illustrating a temporary carrier and a supporter in accordance with some embodiments of the present disclosure. Referring to FIG. 3, the temporary carrier 12 has a circular shape.

Figure 4:
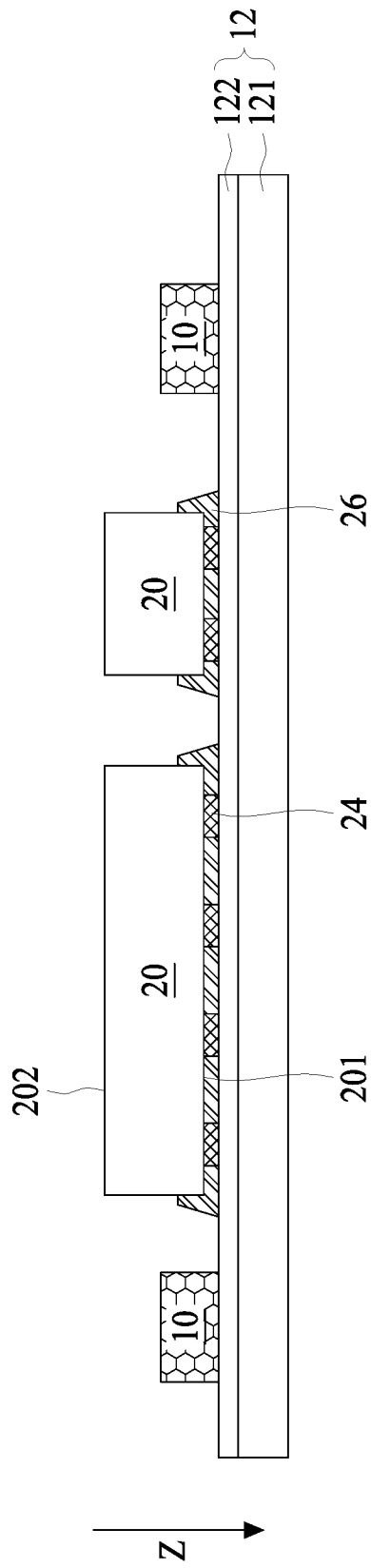
FIG. 4 illustrates a method of manufacturing a semiconductor package structure in accordance with some embodiments of the present disclosure.

FIG. 4 illustrates a method of manufacturing a semiconductor package structure in accordance with some embodiments of the present disclosure. Referring to FIG. 4, the temporary carrier 12 is a composite carrier including a film stack. For example, the temporary carrier 12 includes a conductive film 121 and an insulation film 122 stacked to each other.

Figure 5:
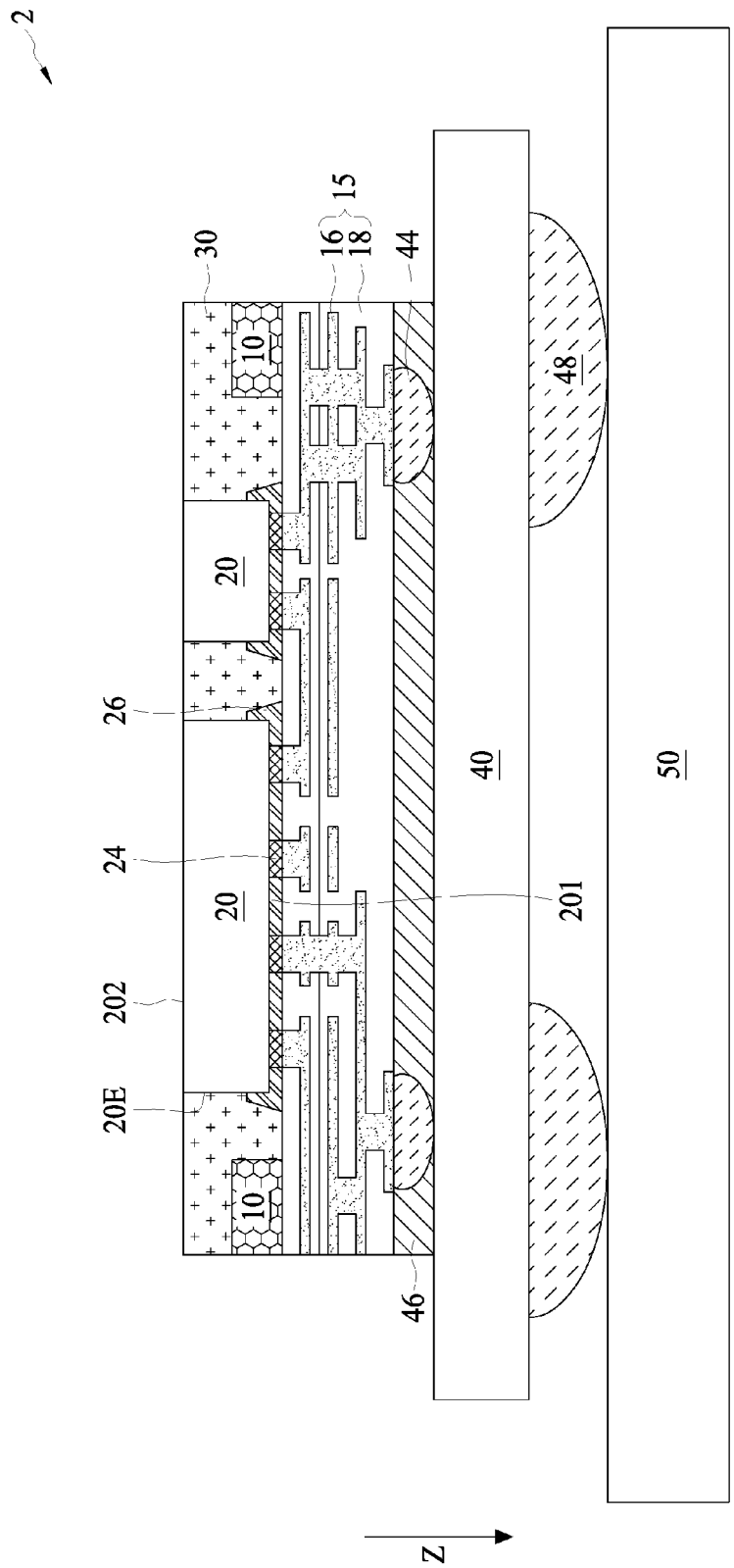
FIG. 5 is a schematic diagram illustrating a semiconductor package structure in accordance with some embodiments of the present disclosure.

FIG. 5 is a schematic diagram illustrating a semiconductor package structure 2 in accordance with some embodiments of the present disclosure. Referring to FIG. 5, the encapsulant 30 of the semiconductor package structure 2 is thinned by, for example, grinding to expose the second surface 202 of the chip 20, but the encapsulant 30 still covers the supporter 10.

Figure 6:
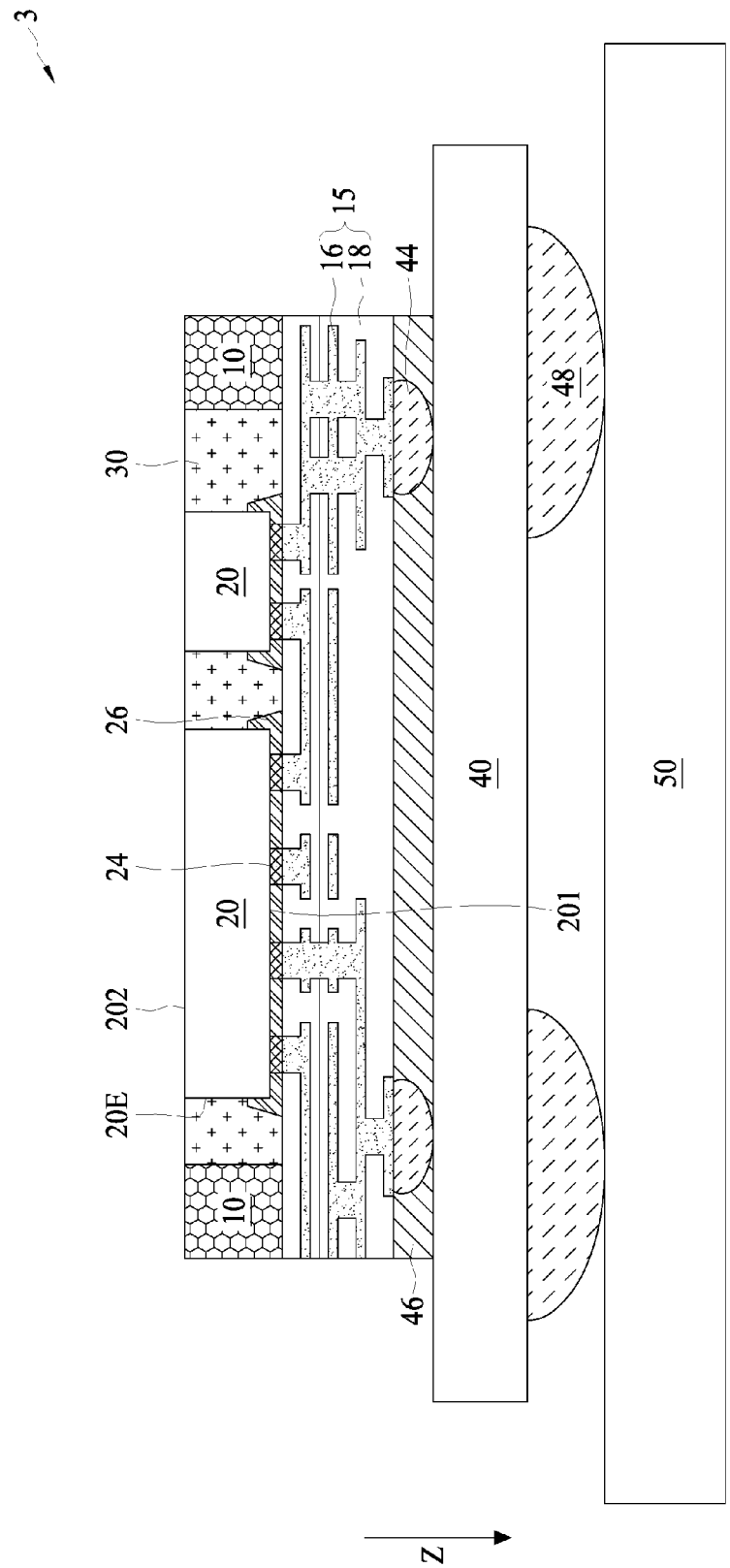
FIG. 6 is a schematic diagram illustrating a semiconductor package structure in accordance with some embodiments of the present disclosure.

FIG. 6 is a schematic diagram illustrating a semiconductor package structure 3 in accordance with some embodiments of the present disclosure. Referring to FIG. 6, the encapsulant 30 of the semiconductor package structure 3 is thinned to expose both the second surface 202 of the chip 20 and the supporter 10.

Figure 7:
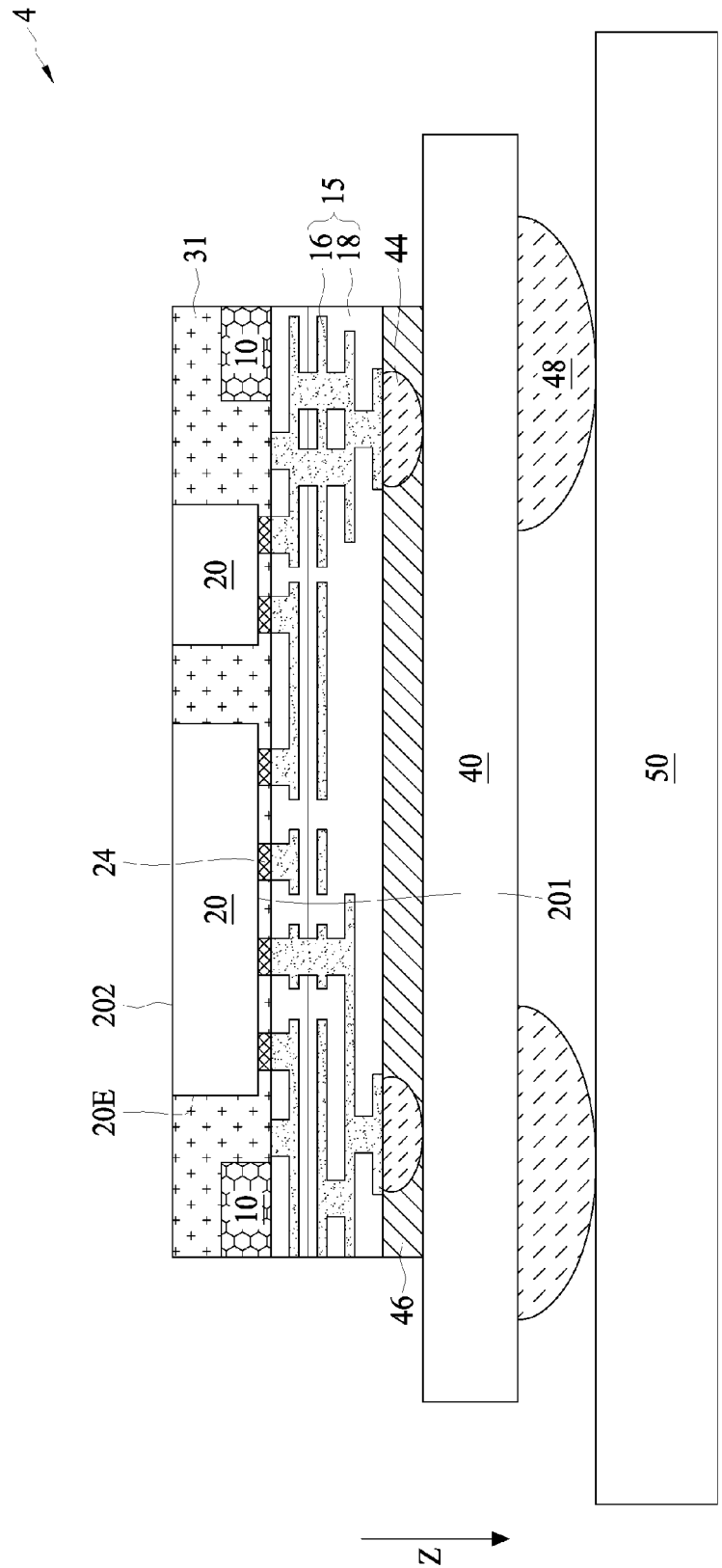
FIG. 7 is a schematic diagram illustrating a semiconductor package structure in accordance with some embodiments of the present disclosure.

FIG. 7 is a schematic diagram illustrating a semiconductor package structure 4 in accordance with some embodiments of the present disclosure. Referring to FIG. 7, the semiconductor package structure 4 includes a molding underfill (MUF) layer 31 covering or surrounding the chip 20 and filling space between the chip 20 and the RDL 15. The molding underfill layer 31 may be formed by molding, gel dispensing or other suitable methods.

Figure 8:
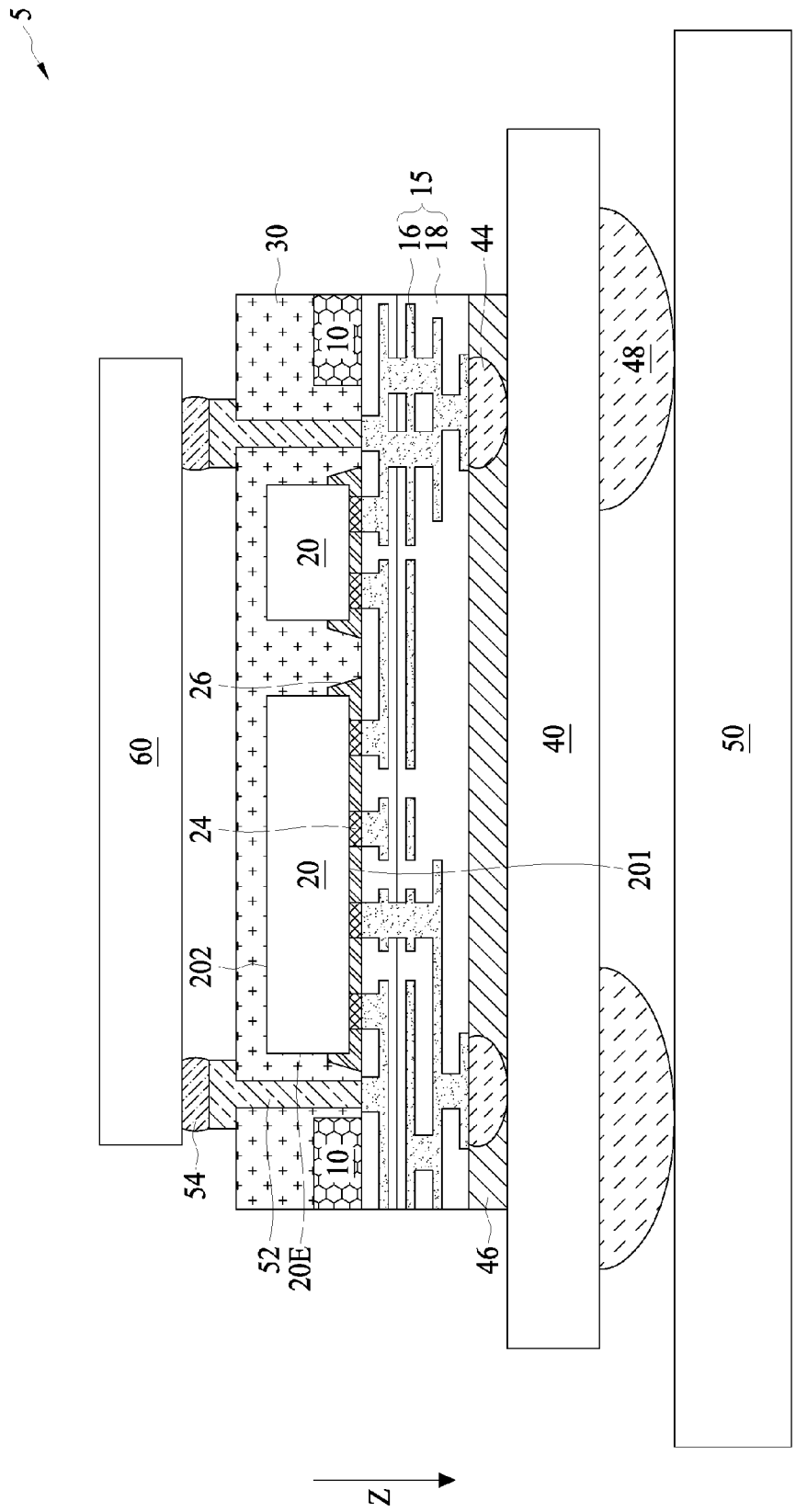
FIG. 8 is a schematic diagram illustrating a semiconductor package structure in accordance with some embodiments of the present disclosure.

FIG. 8 is a schematic diagram illustrating a semiconductor package structure 5 in accordance with some embodiments of the present disclosure. Referring to FIG. 8, the semiconductor package structure 8 includes a second chip 60 facing the second surface 202 of the chip (e.g., the first chip) 20 and electrically connected to the chip 20 through the conductive layer 16. In one or more embodiments, the semiconductor package structure 5 includes one or more TMVs 52 and fourth conductors 54. The TMVs 52 penetrate through the encapsulant 30, thereby electrically connecting the conductive layer 16 of the RDL 15 to the fourth conductors 54. The fourth conductors 54 are formed on the TMVs 52. The fourth conductors 54 may be, but are not limited to, solder bumps. The second chip 60 is electrically connected to the conductive layer 16 through the fourth conductors 54 and the TMVs 52.

Figure 9:
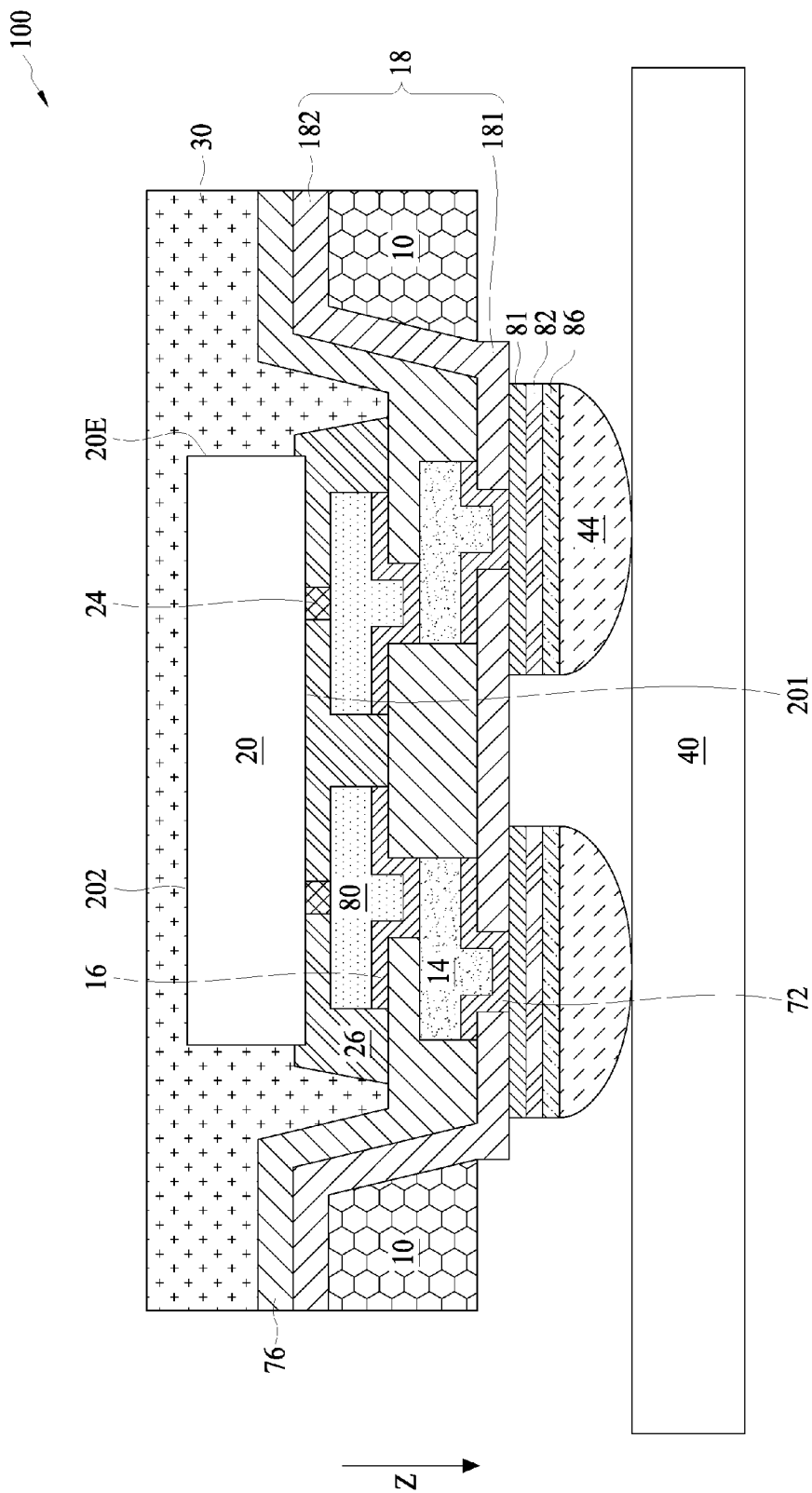
FIG. 9 is a schematic diagram illustrating a semiconductor package structure in accordance with some embodiments of the present disclosure.

FIG. 9 is a schematic diagram illustrating a semiconductor package structure 100 in accordance with some embodiments of the present disclosure. Referring to FIG. 9, the semiconductor package structure 100 includes the one or more chips 20, the supporter 10, the conductive layer 16, the insulation layer 18 and the encapsulant 30. The chip 20 has the first surface 201 and the second surface 202 opposite the first surface 201. The supporter 10 surrounds the edge 20E of the chip 20. The supporter 10 may be a rigid supporter or a soft supporter. The material for the rigid supporter may be conductive material including metal or alloy such as copper, nickel, gold, silver or stainless steel, insulation material such as silicon, glass, ceramics, organic material, or other suitable materials. The material for the soft supporter may be rubber, thermoplastic material, thermoelastic material, or other suitable materials. The supporter 10 is configured as a stiffener to enhance mechanical robustness. The conductive layer 16 is disposed over the first surface 201 of the chip 20 and electrically connected to the chip 20. The insulation layer 18 is disposed over the conductive layer 16. The insulation layer 18 includes the first portion 181 and the second portion 182 connected to each other. The first portion 181 overlaps the chip 20 in the vertical projection direction Z, the second portion 182 overlaps the supporter 10 in the vertical projection direction Z, and the first portion 181 and the second portion 182 are disposed at different horizontal levels. The encapsulant 30 is disposed between the chip 20 and the supporter 10, and the encapsulant 30 at least surrounds the edge 20E of the chip 20. In one or more embodiments, the encapsulant 30 covers the second surface 202 of the chip 20 and the supporter 10.

In one or more embodiments, the semiconductor package structure 100 further includes a passivation layer 76 between the chip 20 and the insulation layer 18. The passivation layer 76 may extend to overlap the supporter 10 in the vertical projection direction Z.

The semiconductor package structure 100 further includes the conductors 24 formed between the first surface 201 of the chip 20 and the conductive layer 16. The chip 20 and the conductive layer 16 are electrically connected to each other through the conductors 24. In one or more embodiments, the conductors 24 may include contact pads electrically connected to respective bonding pads 80, and the underfill layer 26 is filled between the chip 20 and the conductive layer 16.

In one or more embodiments, the semiconductor package structure 100 further includes an RDL 14 embedded in the insulation layer 18 and electrically connected to the chip 20 through the conductive layer 16. In one or more embodiments, the semiconductor package structure 100 further includes the package substrate 40, and the second conductors 44 between the insulation layer 18 and the package substrate 40. The RDL 14 and the package substrate 40 are electrically connected through the second conductors 44. In one or more embodiments, bonding pads 82 and under bump metallurgies (UBMs) 86 may be interposed between the second conductors 44 and the RDL 14.

In some embodiments, a seed layer (e.g., a first seed layer) 72 is formed over the insulation layer 18 and in the openings of the insulation layer 18 and another seed layer (e.g., a second seed layer) 81 is formed over the backside of the seed layer 72. In some embodiments, the bonding pads 82 and UBMs 86 are formed over the seed layer 81.

The encapsulant 30, the supporter 10 and the insulation layer 18 are bonded to one another to enhance the robustness of the semiconductor package structure 100, and thus no carrier or interposer may be used. Accordingly, the thickness of the semiconductor package structure 100 can be reduced, and warpage of the semiconductor package structure 100 can be alleviated. In addition, the insulation layer 18 or the encapsulant 30 is partially fixed on the supporter 10, and thus surface wrinkling is mitigated.

Figure 10A:
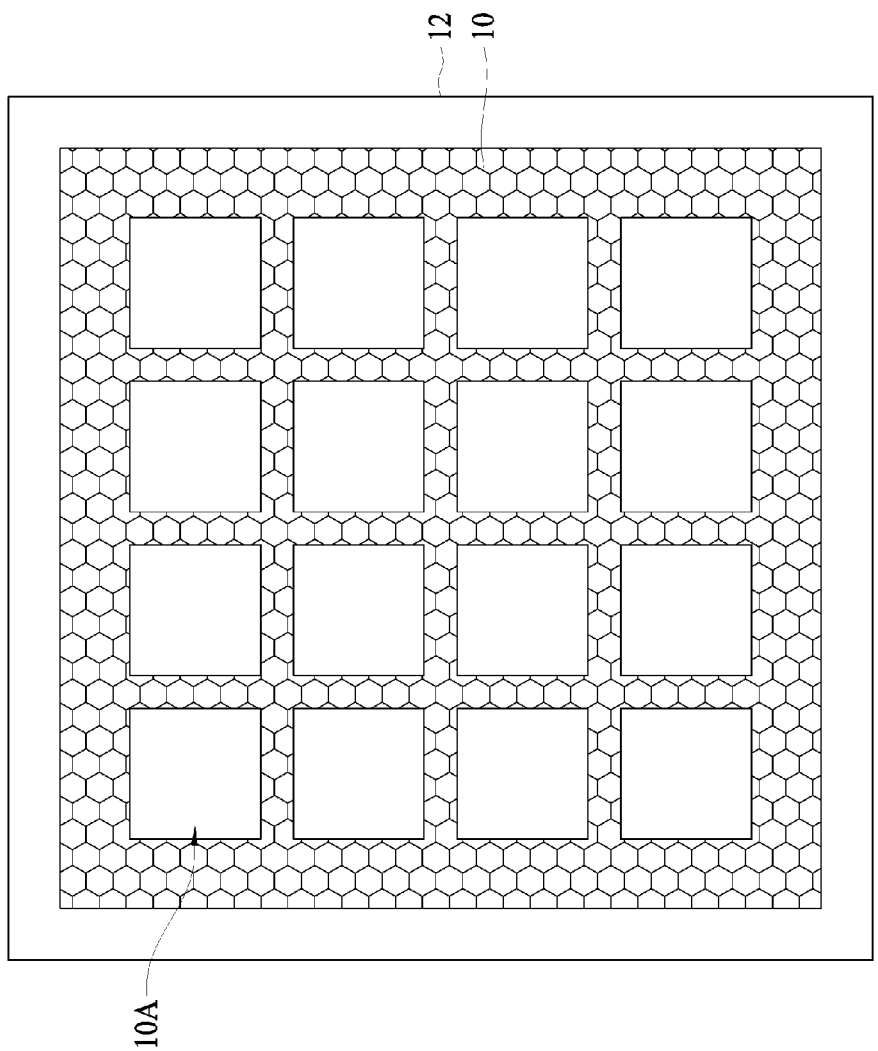
FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L and FIG. 10M illustrate a method of manufacturing a semiconductor package structure in accordance with some embodiments of the present disclosure.
Figure 10B:
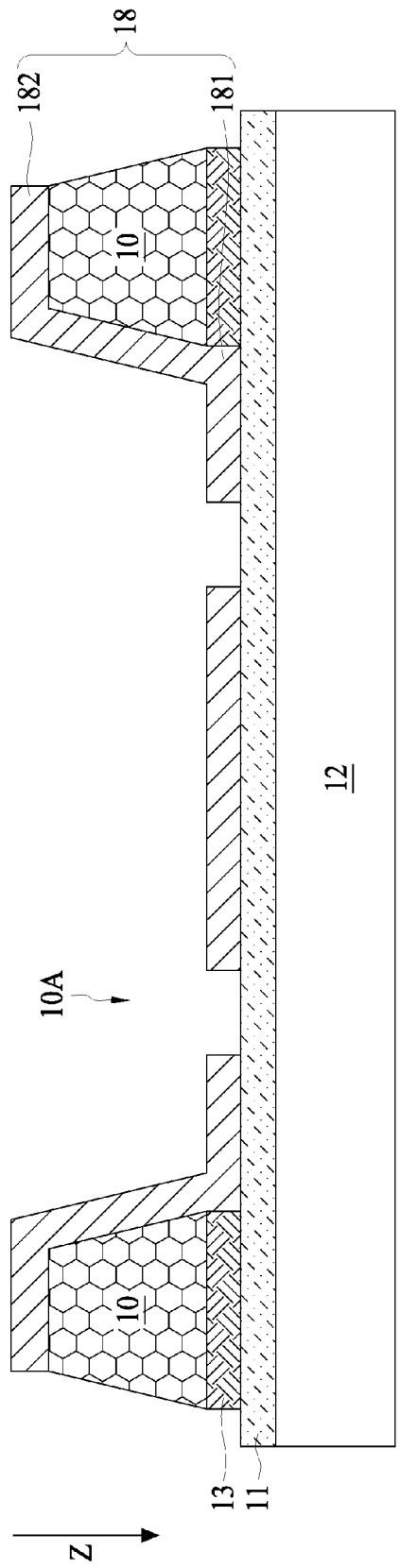

FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L and FIG. 10M illustrate a method of manufacturing a semiconductor package structure in accordance with some embodiments of the present disclosure. It is appreciated that the method may be a wafer-level manufacturing method, and one semiconductor package structure is illustrated for clarity of discussion. The supporter 10 is formed over the temporary carrier 12 as shown in FIGS. 10A and 10B, where FIG. 10A is an overhead view and FIG. 10B is a partial cross-sectional side view of FIG. 10A. In one or more embodiments, the temporary carrier 12 is covered with a release layer 11, and the supporter 10 is adhered to the release layer 11 with an adhesion layer (e.g., a first adhesion layer) 13. In one or more embodiments, the adhesion layer 13 is disposed between a portion of the temporary carrier 12 and the supporter 10. In one or more embodiments, the temporary carrier 12 has a square shape, and the supporter 10 has a square grid pattern defining a number of square cavities 10A for accommodating chips. The supporter 10 may be a rigid supporter or a soft supporter. The supporter 10 is configured as a stiffener to provide mechanical robustness.

Referring to FIG. 10B, the insulation layer 18 is formed over the temporary carrier 12 and the supporter 10. The insulation layer 18 includes the first portion 181 and the second portion 182 connected to each other. The first portion 181 is formed in the cavity 10A, the second portion 182 overlaps the supporter 10 in the vertical projection direction Z, and the first portion 181 and the second portion 182 are disposed at different horizontal levels. The first portion 181 of the insulation layer 18 has one or more openings exposing the temporary carrier 12.

Figure 10C:
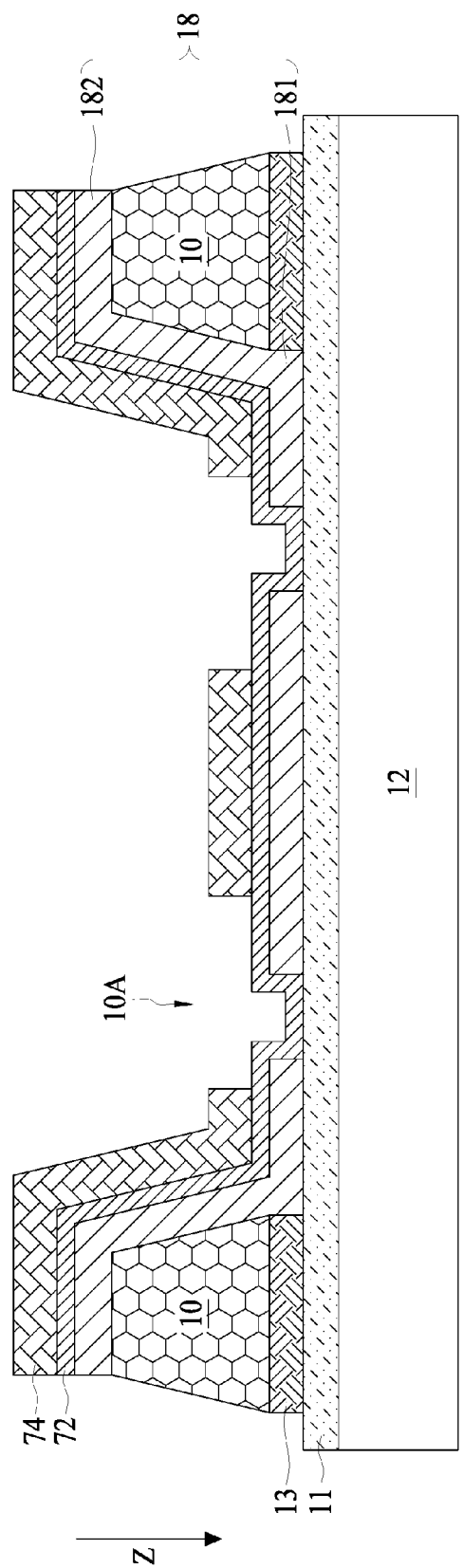

Referring to FIG. 10C, the seed layer 72 is formed over the insulation layer 18 and in the openings of the insulation layer 18. Subsequently, a resist layer 74 such as a dry-film photoresist layer is formed over the insulation layer 18. The resist layer 74 includes one or more openings substantially corresponding to the openings of the insulation layer 18, partially exposing the seed layer 72. In one or more embodiments, the dimensions of the opening of the resist layer 74 is larger than that of the opening of the insulation layer 18.

Figure 10D:
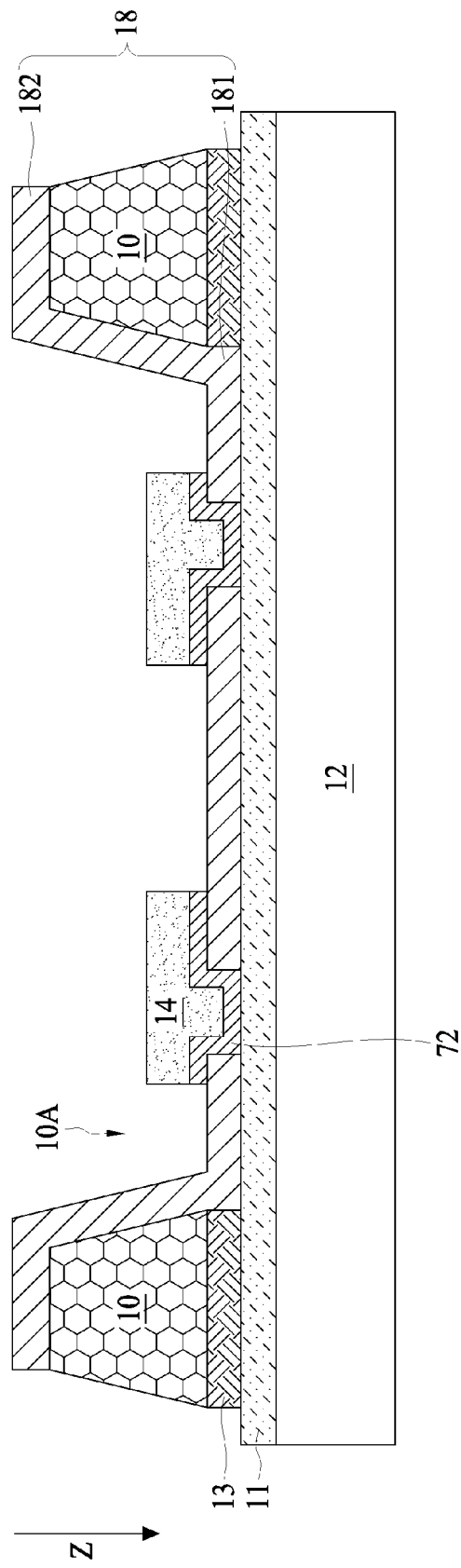
Figure 10E:
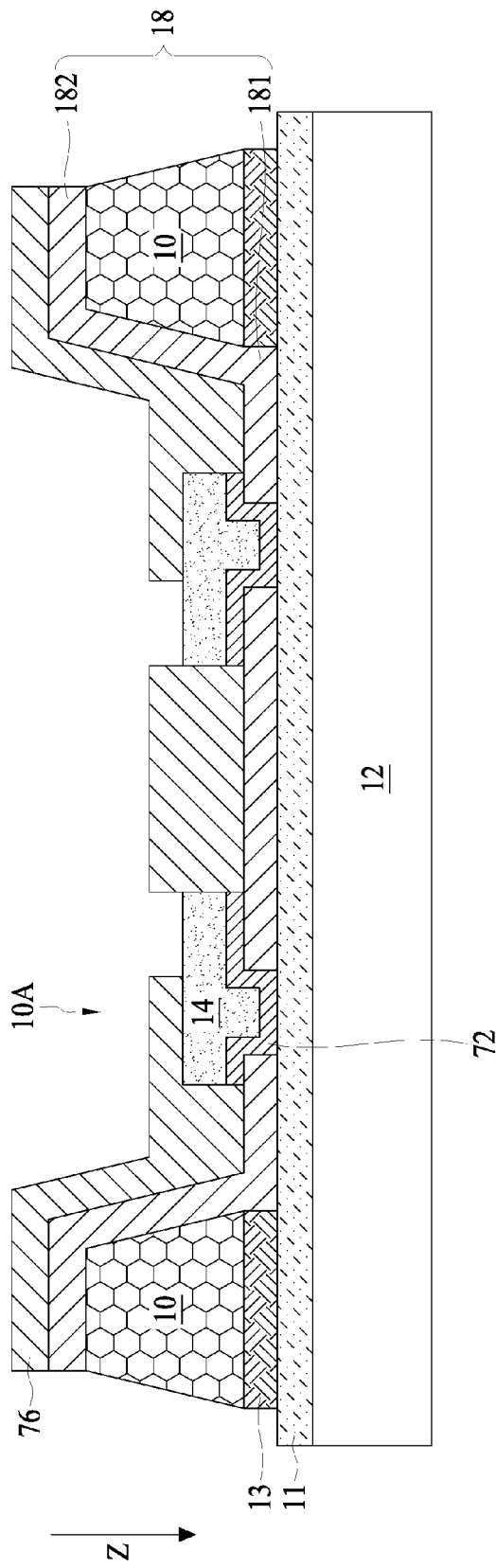

Referring to FIG. 10D, the RDL 14 is formed over the seed layer 72. In one or more embodiments, the RDL 14 is formed by plating. The RDL 14 may include one or more layers of conductive patterns. Subsequently, the resist layer 74 and the seed layer 72 exposed from the RDL 14 are removed. Referring to FIG. 10E, the passivation layer 76 is formed over the insulation layer 18. The passivation layer 76 has one or more openings exposing one or more portions of the RDL 14.

Figure 10F:
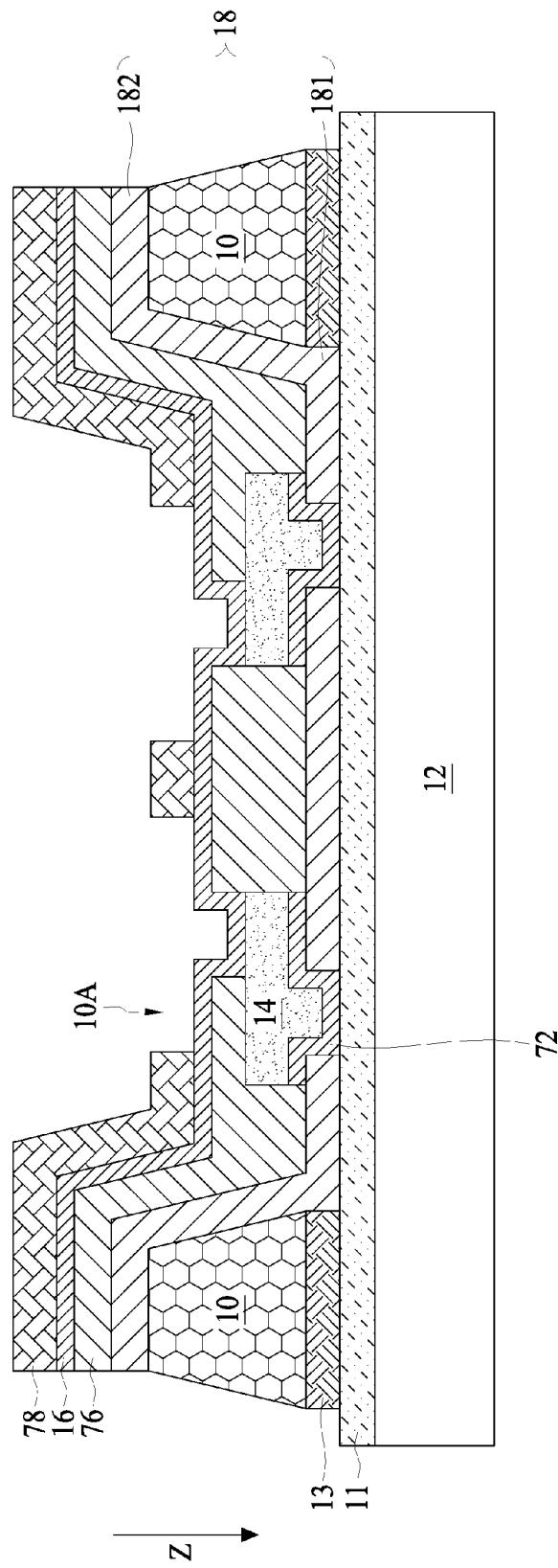

Referring to FIG. 10F, the conductive layer 16 is formed over the passivation layer 76 and electrically connected to the RDL 14 through the openings of the passivation layer 76.

In one or more embodiments, the conductive layer 16 is configured as a seed layer. Then, another resist layer 78 such as a dry-film photoresist layer is formed over the conductive layer 16. The resist layer 78 has one or more openings exposing a portion of the conductive layer 16.

Figure 10G:
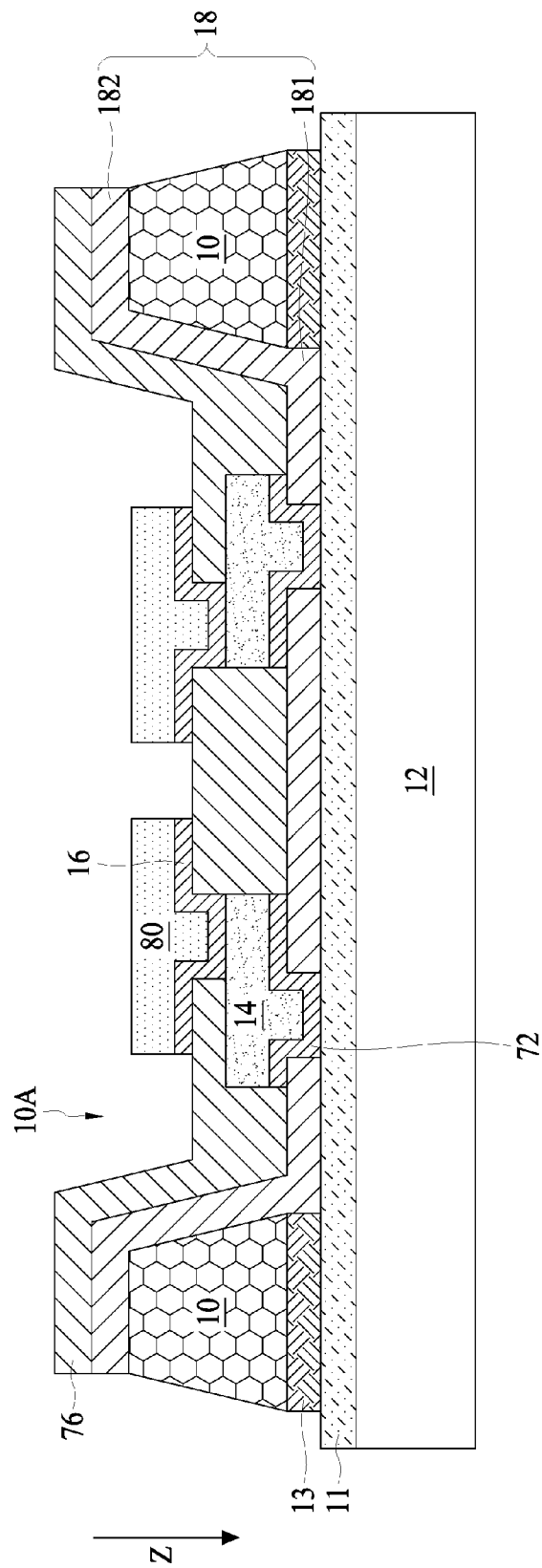

Referring to FIG. 10G, one or more bonding pads 80 are formed over the conductive layer 16 exposed from the resist layer 78. In one or more embodiments, the bonding pads 80 are formed by plating. The resist layer 78 is then removed.

Figure 10H:
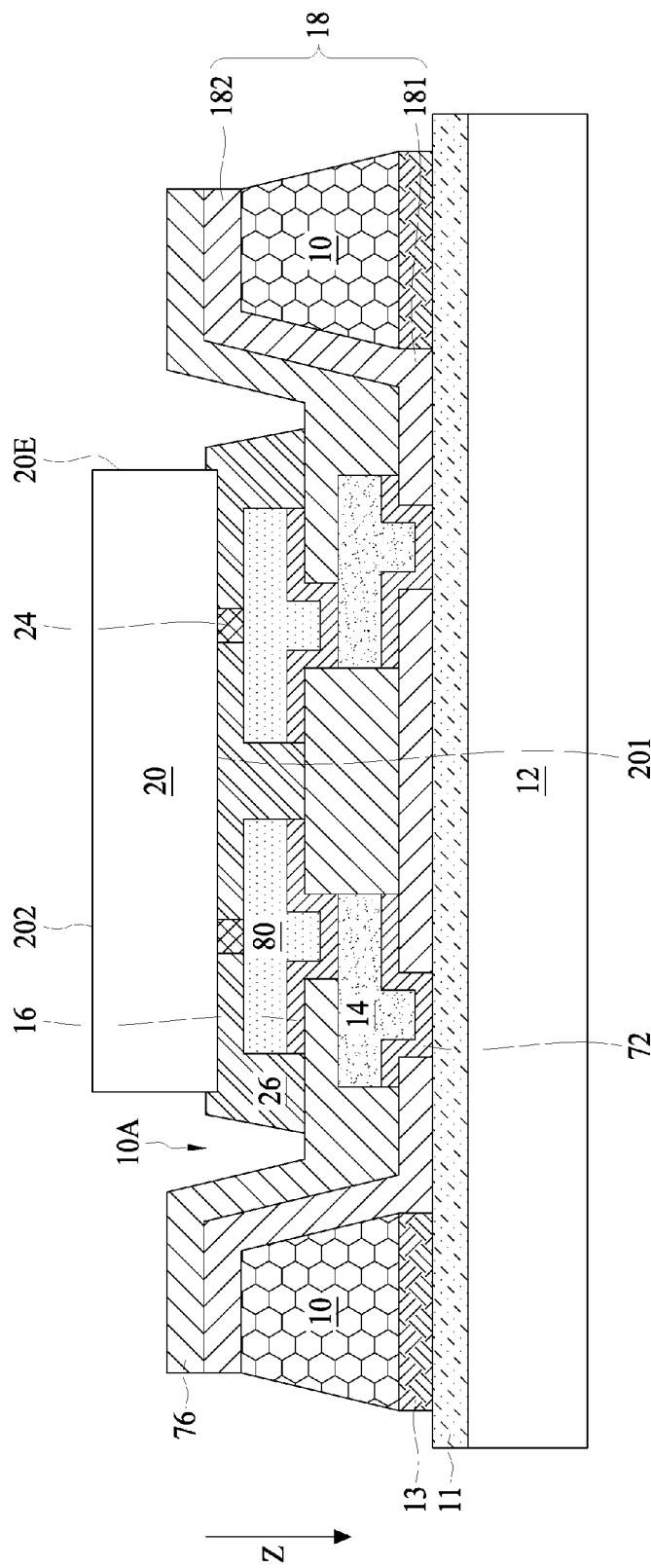

Referring to FIG. 10H, the one or more chips 20 are disposed over the temporary carrier 12 in the cavity 10A defined by the supporter 10. The chip 20 has the first surface 201 facing the temporary carrier 12, and the second surface 202 facing away from the temporary carrier 12. In one or more embodiments, the chip 20 includes the conductors 24 formed on the first surface 201, and electrically connected to the bonding pads 80. Subsequently, the underfill layer 26 is formed between the chip 20 and the passivation layer 76 surrounding the conductors 24. The underfill layer 26 may be replaced with an adhesive layer formed by gel dispensing.

Figure 10I:
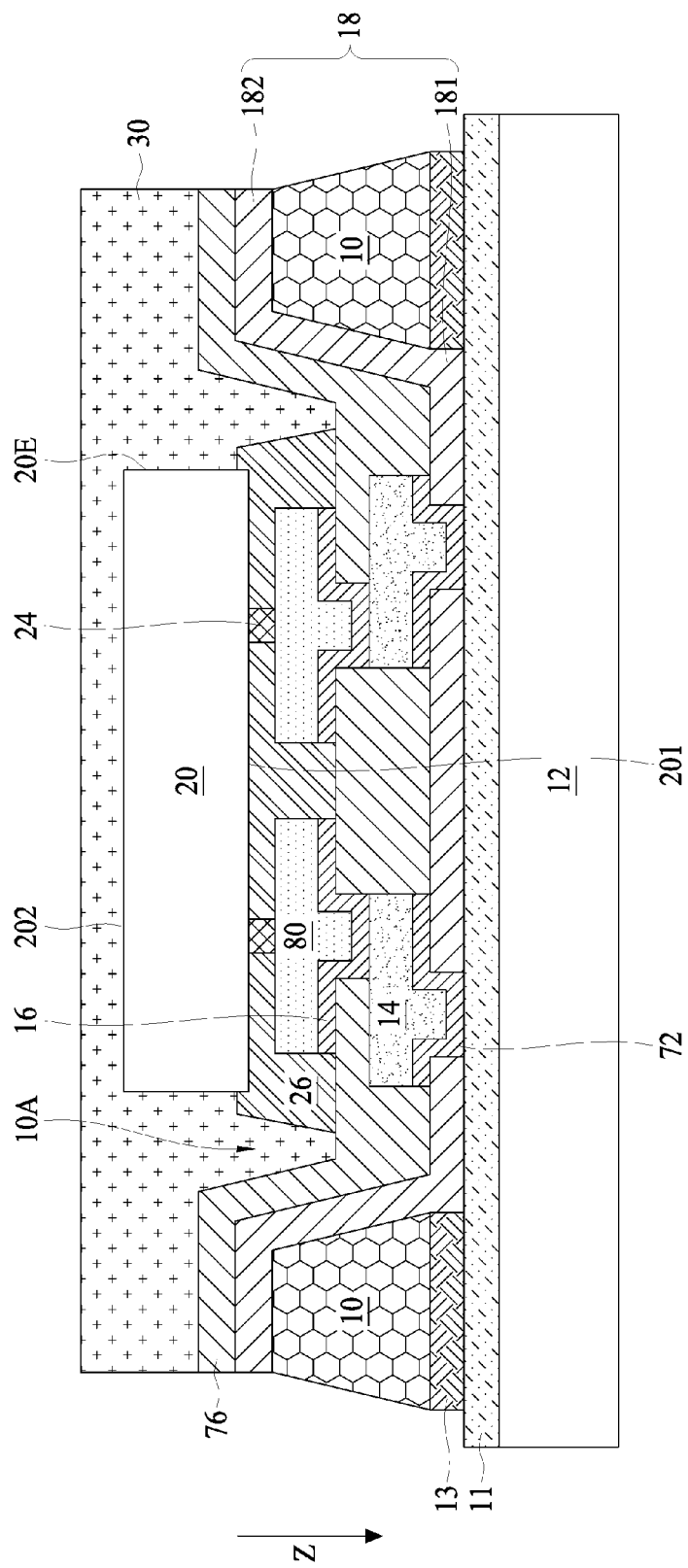

Referring to FIG. 10I, the encapsulant 30 is formed, covering the supporter 10 and the second surface 202 of the chip 20. In one or more embodiments, the encapsulant 30 is formed by molding. The encapsulant 30 covers and engages with the supporter 10, thereby forming a structure with sufficient mechanical strength to hold the chip 20.

Figure 10J:
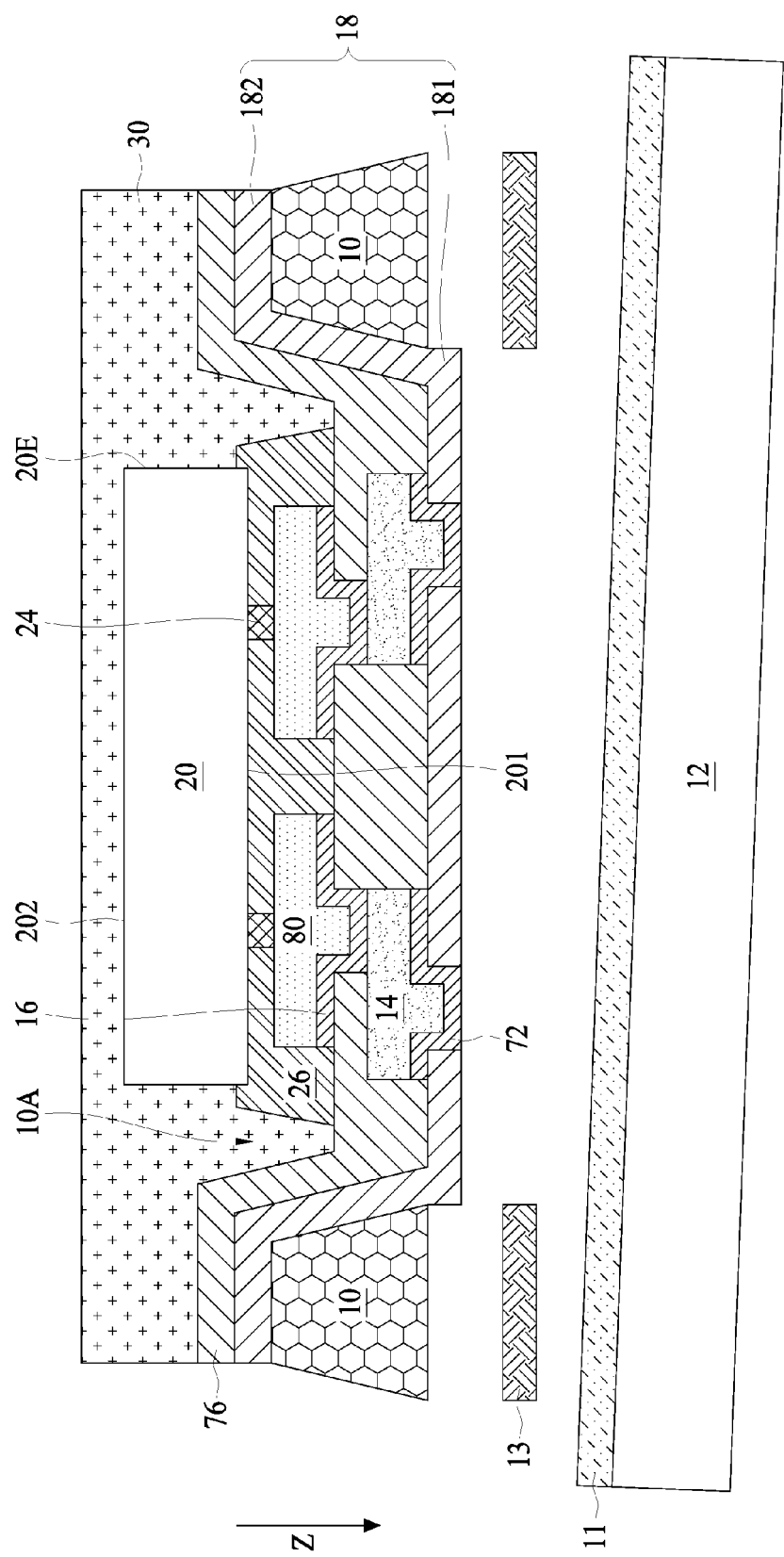

Referring to FIG. 10J, the temporary carrier 12 is released from the supporter 10 and the chip 20. In one or more embodiments, the release layer 11 is cured optically to reduce its adhesion strength to the insulation layer 18 so that the temporary carrier 12 as well as the release layer 11 can be released from the insulation layer 18. In one or more embodiments, the adhesion layer 13 is thermally cured to be released from the supporter 10.

Figure 10K:
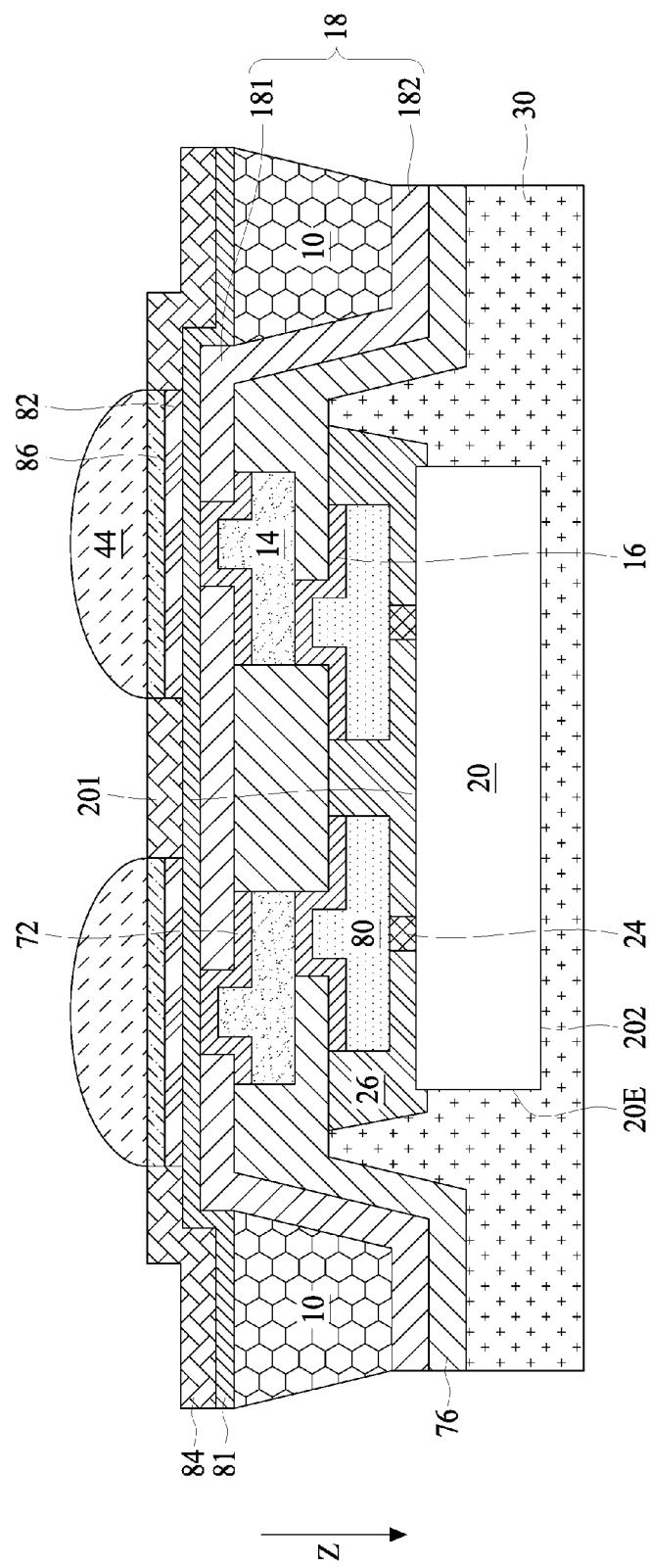
Figure 10L:
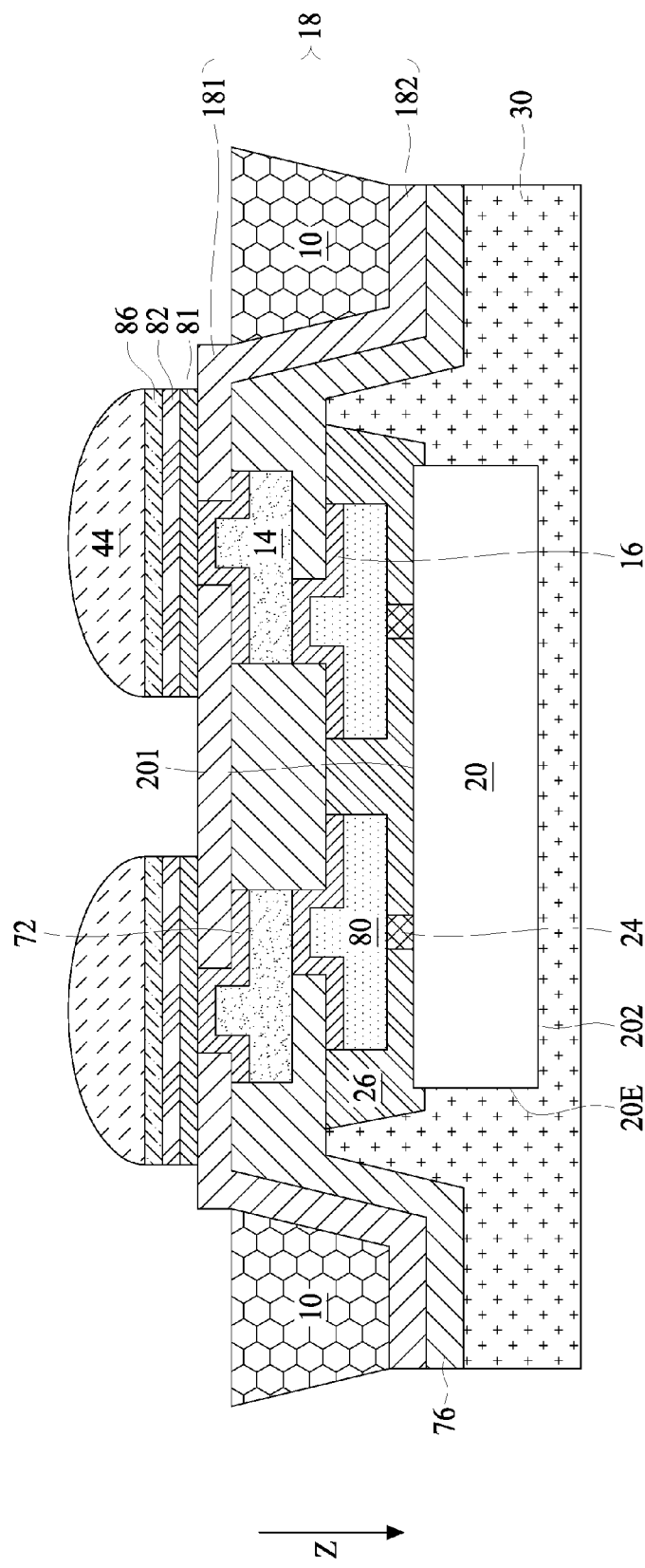

Referring to FIG. 10K, another seed layer (e.g., the second seed layer) 81 is formed over the backside of the seed layer (e.g., the first seed layer) 72. Then, a resist layer 84 such as a photoresist layer is formed over the seed layer 81. The resist layer 84 has one or more openings exposing a portion of the seed layer 81. Subsequently, the bonding pads 82 and the UBMs 86 are formed over the exposed seed layer 81 through the openings of the resist layer 84. Following that, the second conductors 44 are formed over the UBMs 86. Referring to FIG. 10L, the resist layer 84 and the portion of the seed layer 81 uncovered by the second conductors 44 are removed.

Figure 10M:
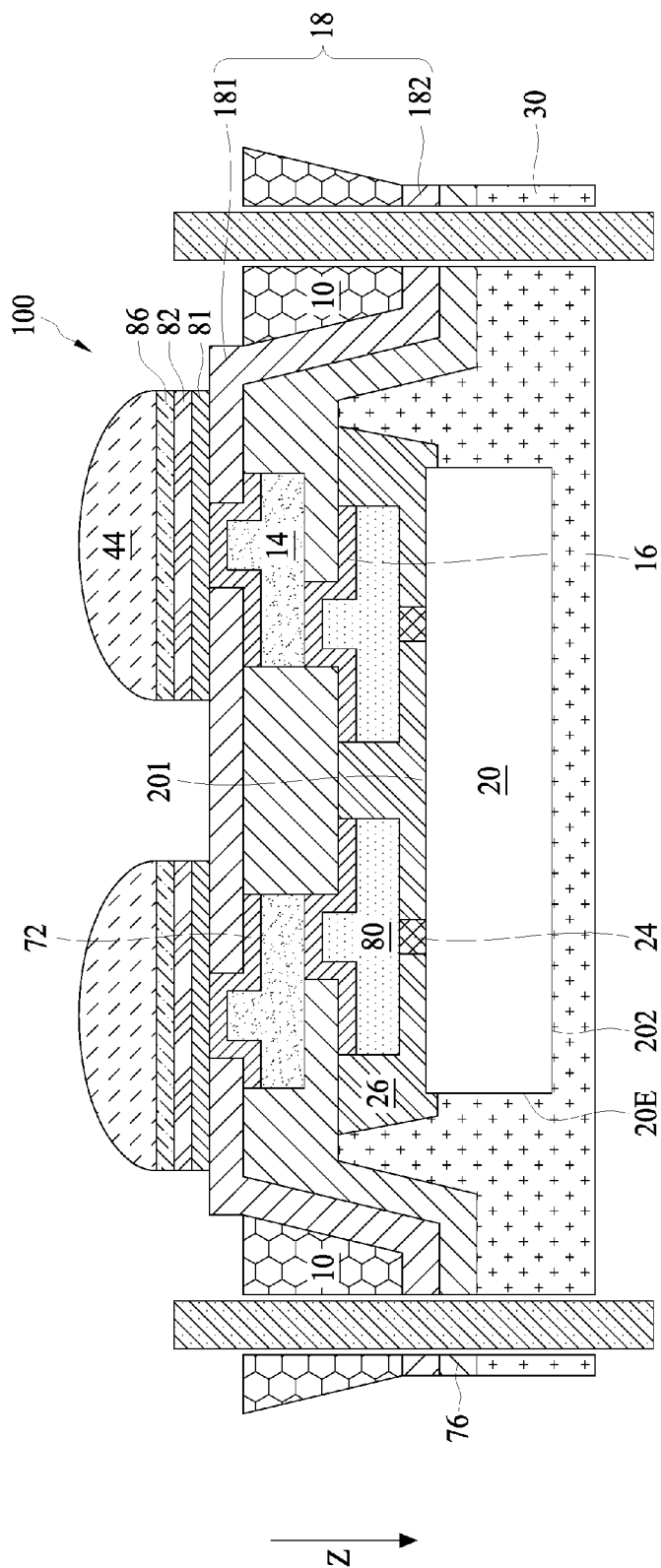

Referring to FIG. 10M, a singulation process is carried out by, for example blade cutting, etching or laser cutting, to form a plurality of semiconductor package structures 100. Subsequently, the semiconductor package structure 100 is electrically connected to a package substrate 40 through the second conductors 44 as illustrated in FIG. 9.

Figure 11A:
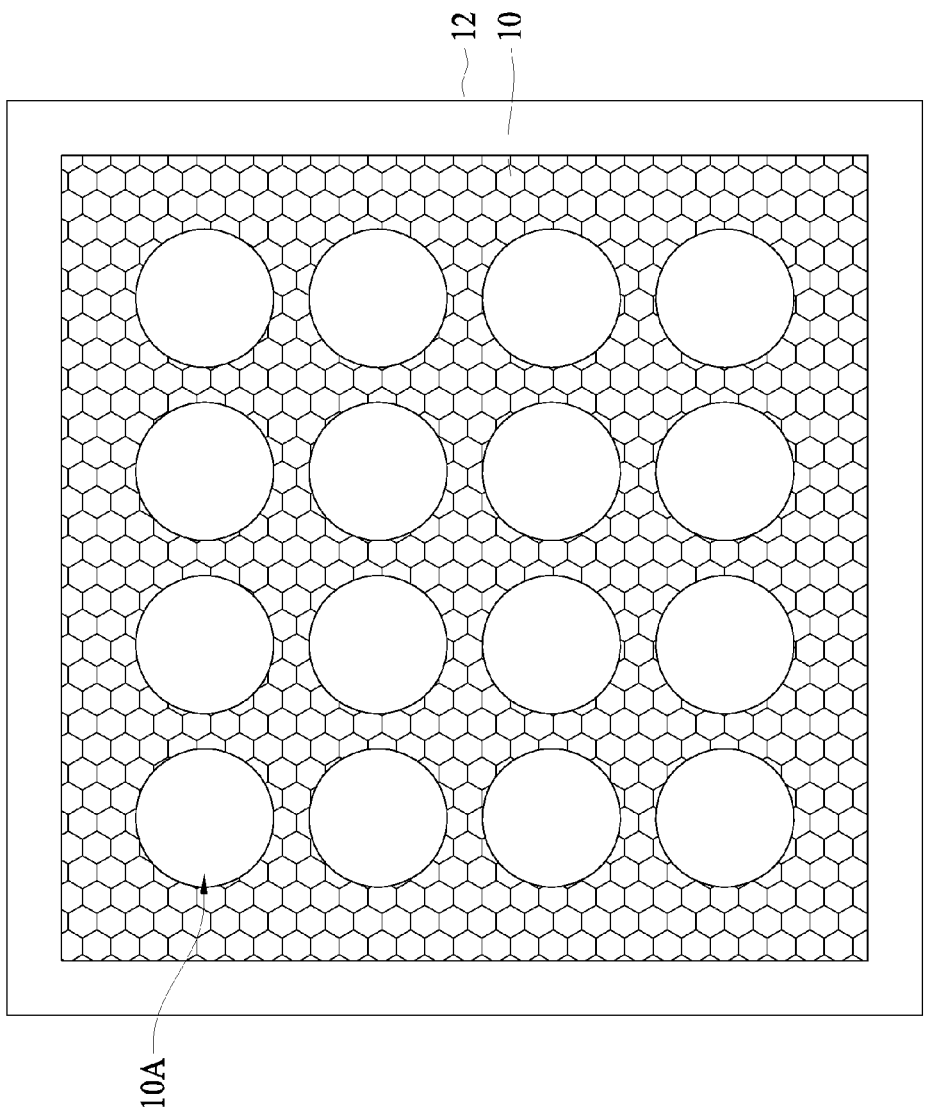
FIG. 11A, FIG. 11B, FIG. 11C and FIG. 11D are schematic diagrams illustrating a temporary carrier and a supporter in accordance with some embodiments of the present disclosure.
Figure 11B:
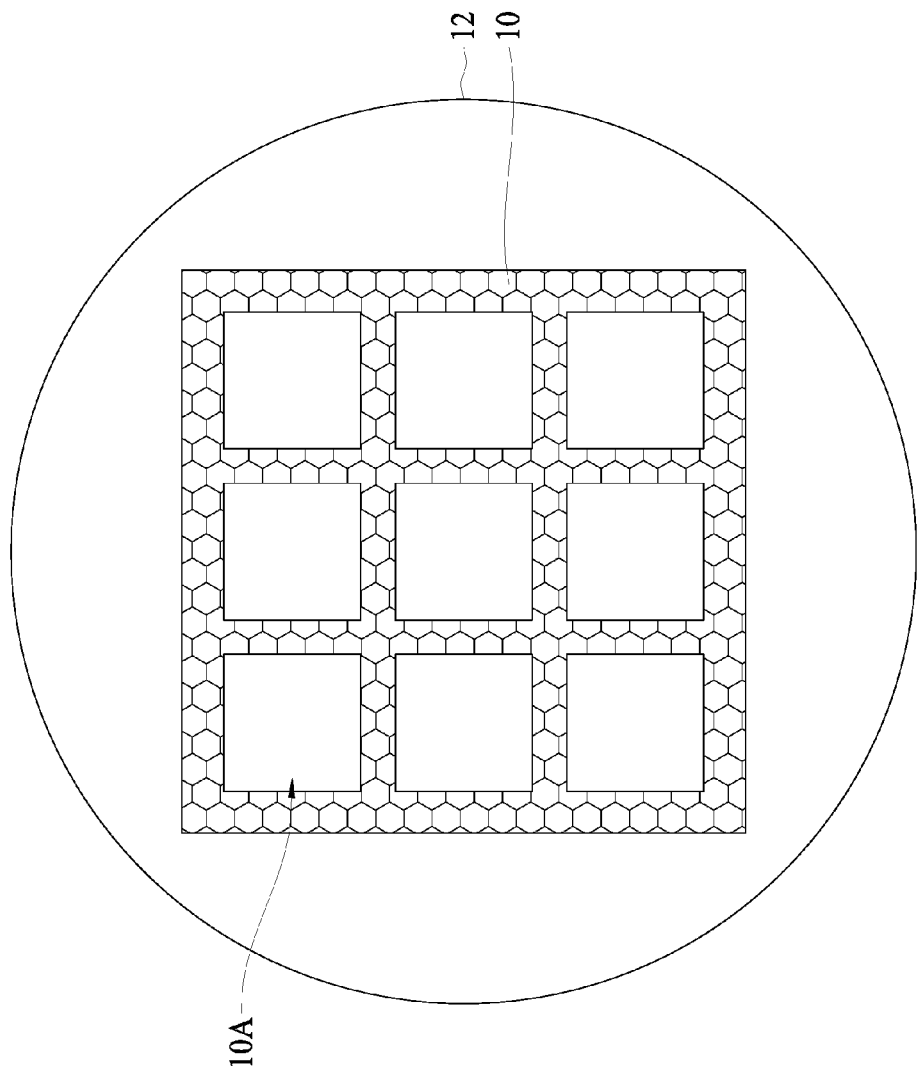
Figure 11C:
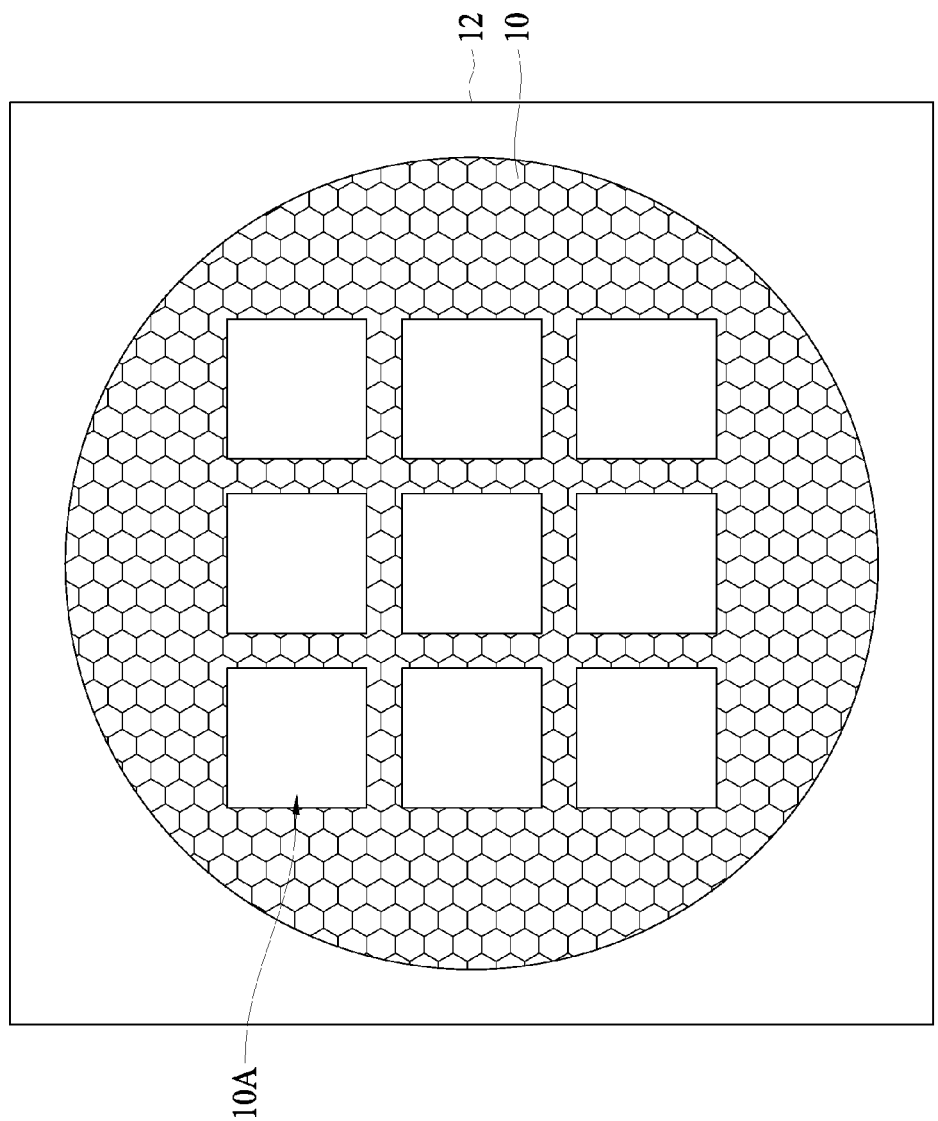
Figure 11D:
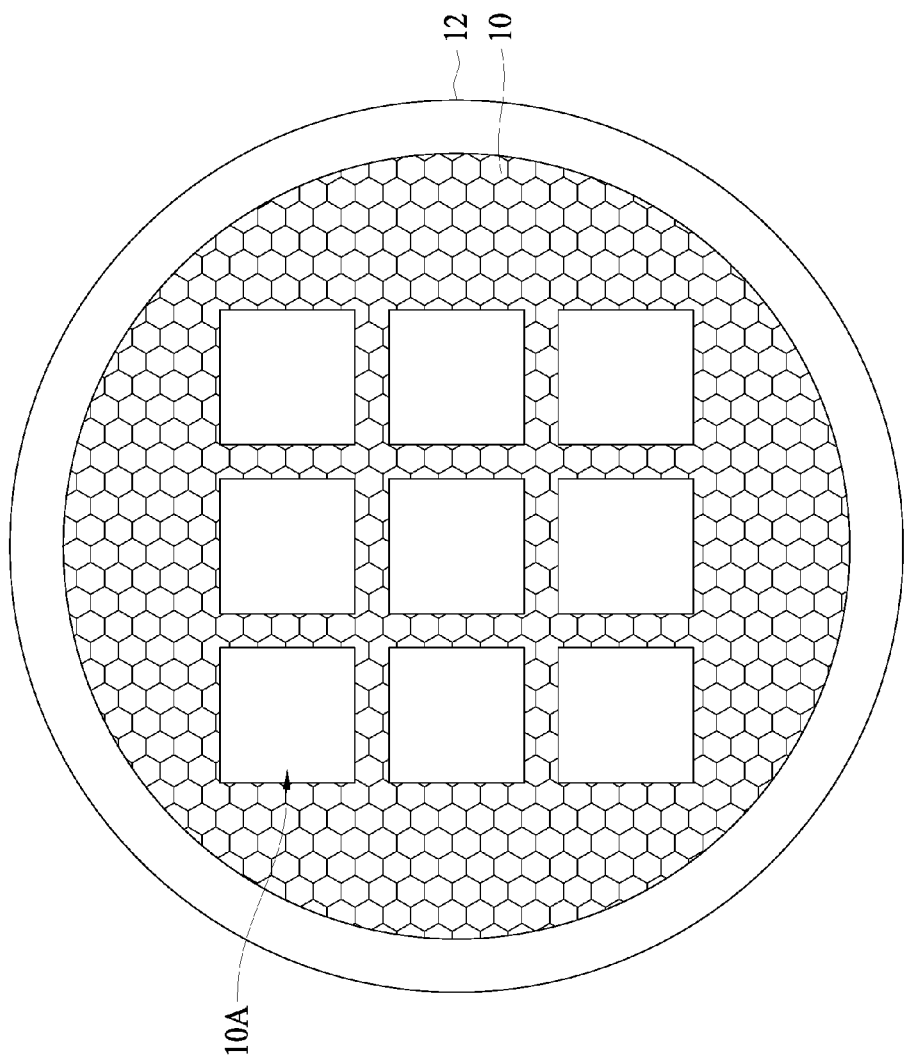

FIGS. 11A, 11B, 11C and 11D are schematic diagrams illustrating a temporary carrier and a supporter in accordance with some embodiments of the present disclosure. Referring to FIG. 11A, the temporary carrier 12 has a square shape, and the supporter 10 has a square grid pattern defining a number of circular cavities 10A. Referring to FIG. 11B, the temporary carrier 12 has a circular shape, and the supporter 10 has a square grid pattern defining a number of square cavities 10A. Referring to FIG. 11C, the temporary carrier 12 has a square shape, and the supporter 10 has a circular grid pattern defining one or more square cavities 10A. Referring to FIG. 11D, the temporary carrier 12 has a circular shape, and the supporter 10 has a circular grid pattern defining a number of square cavities 10A.

Figure 12A:
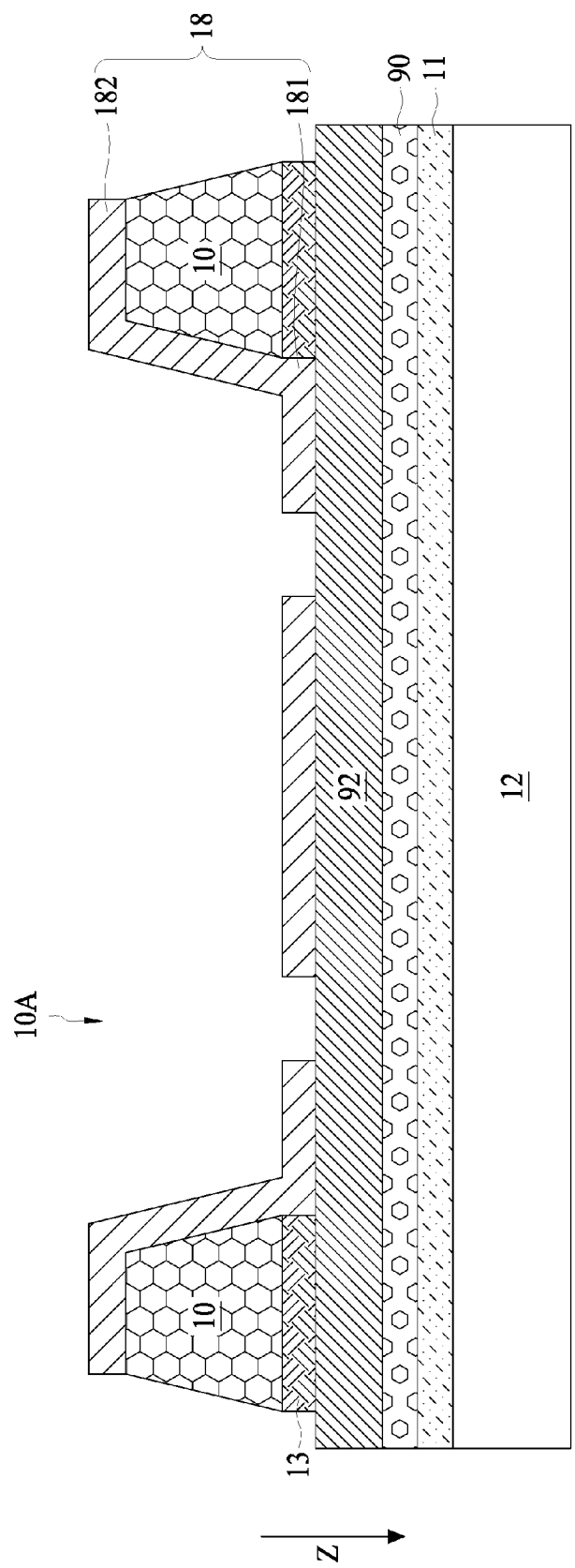
FIG. 12A and FIG. 12B illustrate a method of manufacturing a semiconductor package structure in accordance with some embodiments of the present disclosure.
Figure 12B:
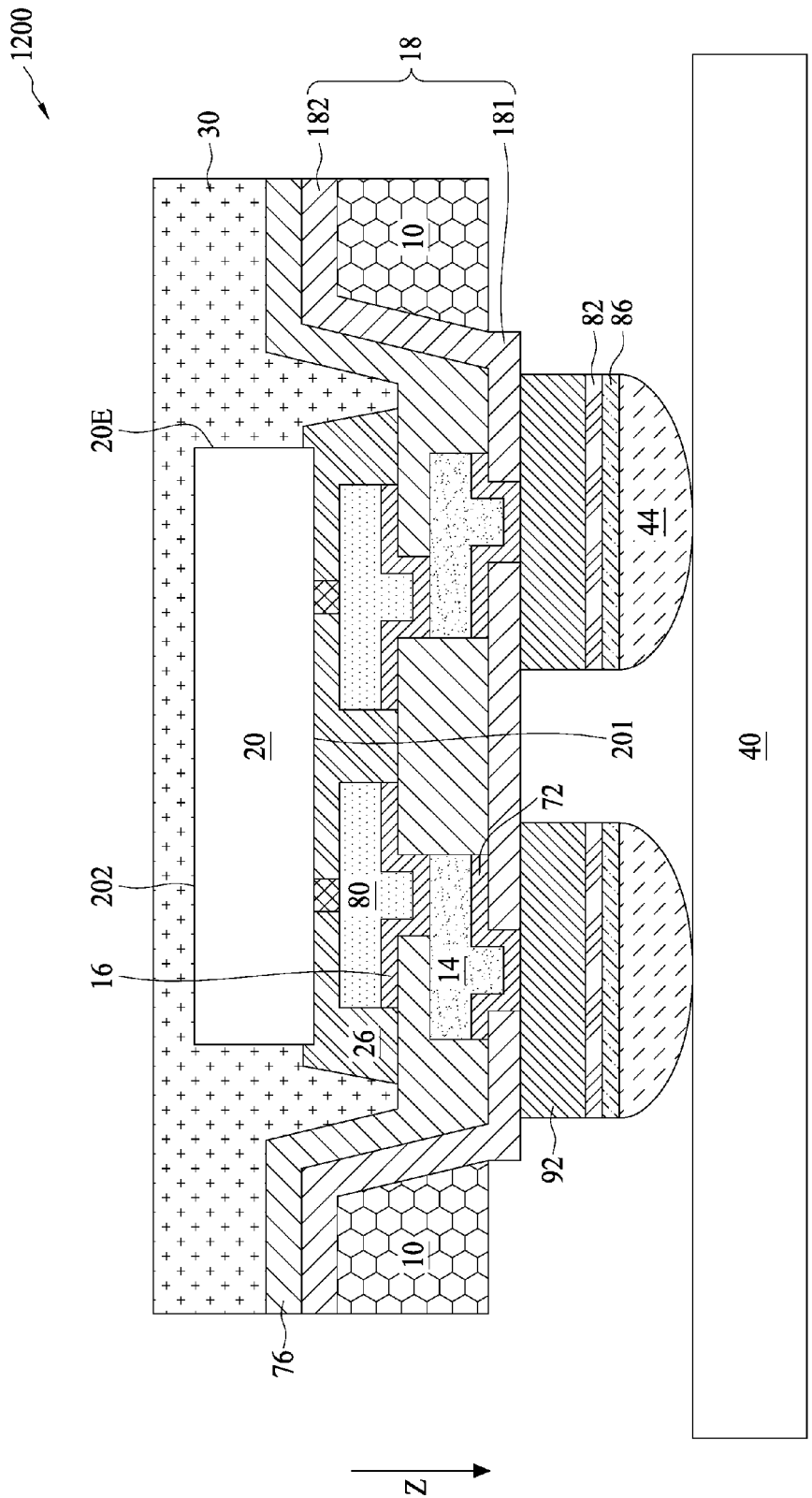

FIGS. 12A and 12B illustrate a method of manufacturing a semiconductor package structure in accordance with some embodiments of the present disclosure. Referring to FIG. 12A, a second adhesion layer 90 and a conductive layer 92 are formed over the release layer 11 prior to forming the supporter 10. In one or more embodiments, the material of the conductive layer 92 includes metal such as copper alloy, nickel alloy or other suitable conductive materials. Referring to FIG. 12B, subsequent processes (e.g., similar to those shown in FIGS. 10A-10M) are performed to form a semiconductor package structure 1200.

Figure 13:
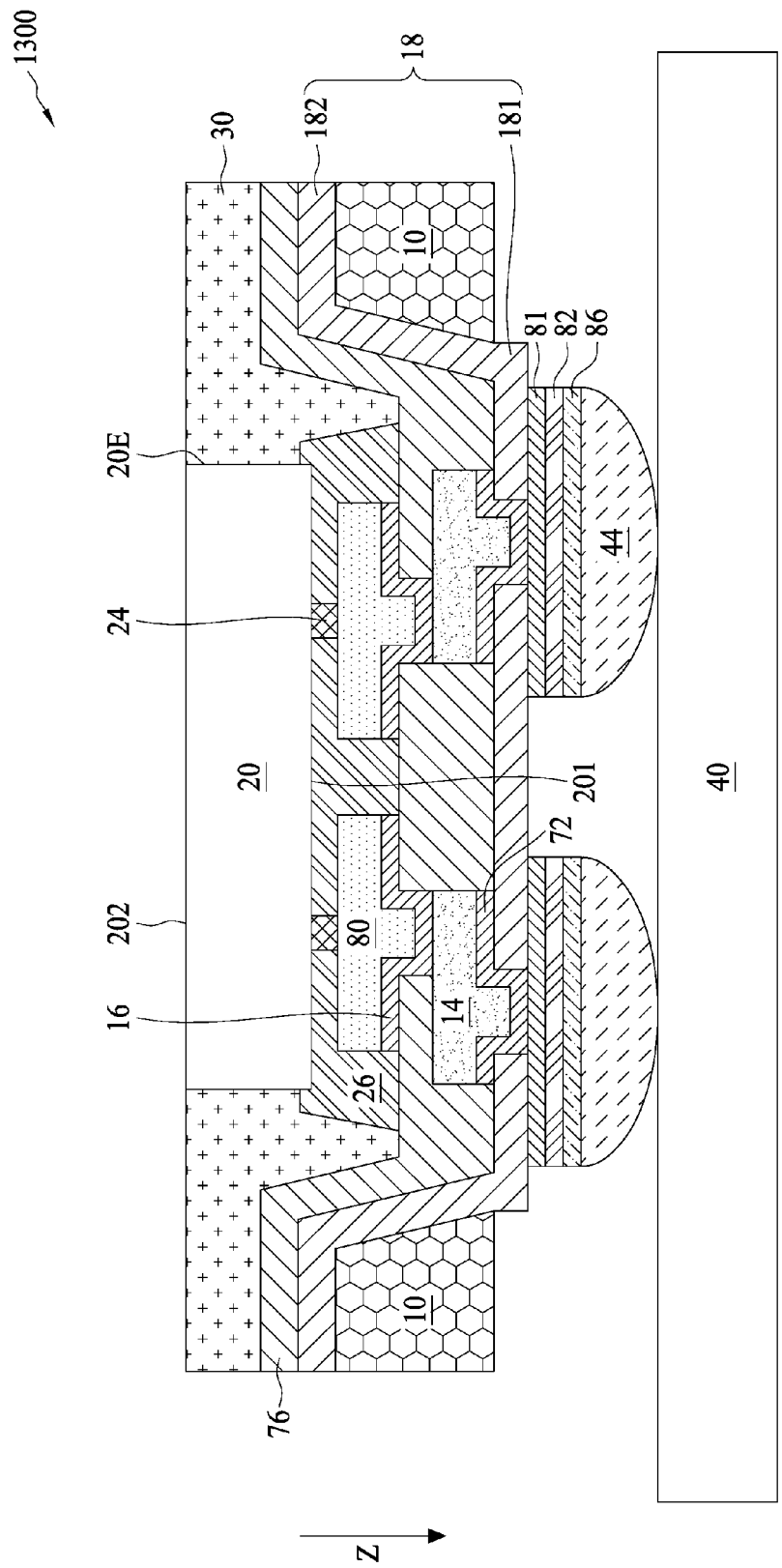
FIG. 13 is a schematic diagram illustrating a semiconductor package structure in accordance with some embodiments of the present disclosure.

FIG. 13 is a schematic diagram illustrating a semiconductor package structure 1300 in accordance with some embodiments of the present disclosure. Referring to FIG. 13, the encapsulant 30 of the semiconductor package structure 1300 is thinned by, for example, grinding to expose the second surface 202 of the chip 20. However, the encapsulant 30 may still cover the passivation layer 76. In one or more embodiments, the encapsulant 30 exposes the second surface 202 of the chip 20 and covers the passivation layer 76 over the supporter 10.

Figure 14:
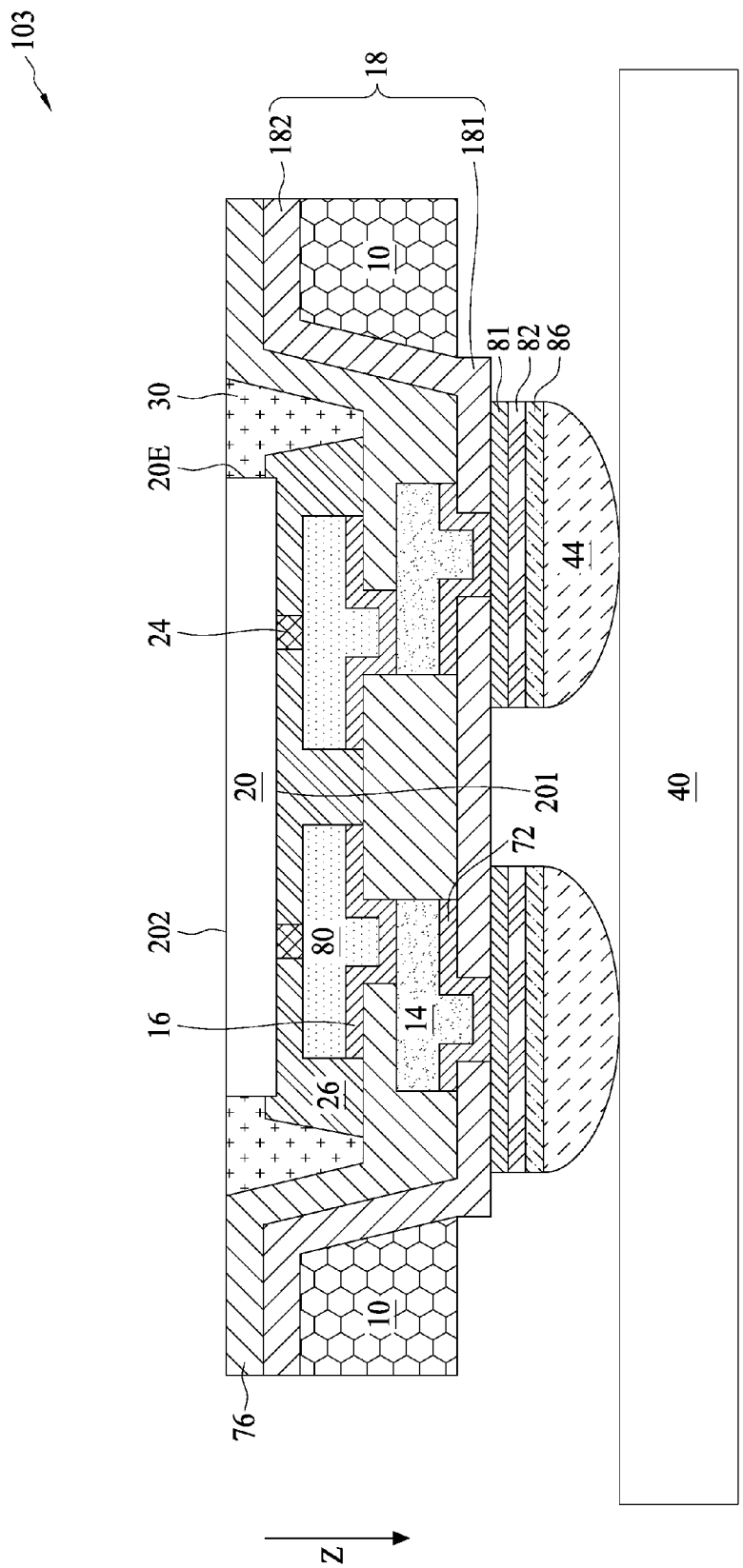
FIG. 14 is a schematic diagram illustrating a semiconductor package structure in accordance with some embodiments of the present disclosure.

FIG. 14 is a schematic diagram illustrating a semiconductor package structure 103 in accordance with some embodiments of the present disclosure. Referring to FIG. 14, the encapsulant 30 of the semiconductor package structure 103 is thinned to expose both the second surface 202 of the chip 20 and the passivation layer 76. In one or more embodiments, the encapsulant 30 exposes the second surface 202 of the chip 20 and the passivation layer 76 over the supporter 10.

Figure 15:
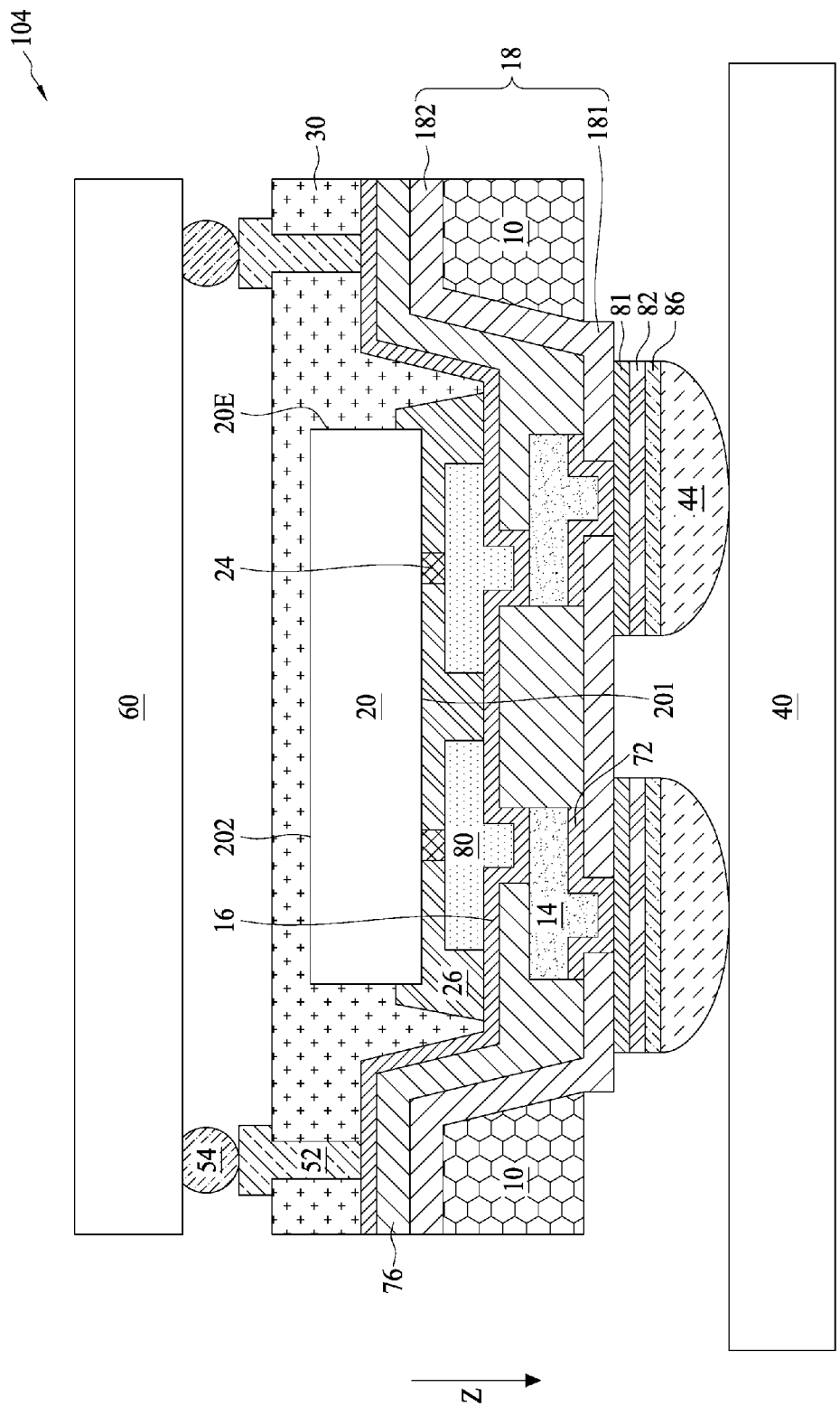
FIG. 15 is a schematic diagram illustrating a semiconductor package structure in accordance with some embodiments of the present disclosure.

FIG. 15 is a schematic diagram illustrating a semiconductor package structure 104 in accordance with some embodiments of the present disclosure. Referring to FIG. 15, the semiconductor package structure 104 includes the second chip 60 facing the second surface 202 of the chip 20. The conductive layer 16 extends toward and overlaps the supporter 10 in the vertical projection direction Z, and the second chip 60 is electrically connected to the chip 20 through the conductive layer 16. In one or more embodiments, the semiconductor package structure 104 further includes one or more TMVs 52 and the fourth conductors 54. The TMVs 52 penetrate through the encapsulant 30, thereby electrically connecting the conductive layer 16 over the supporter 10. The fourth conductors 54 are formed on the TMVs 52. The fourth conductors 54 may be, but are not limited to, solder bumps. The second chip 60 is electrically connected to the conductive layer 16 through the fourth conductors 54 and the TMVs 52.

Figure 16:
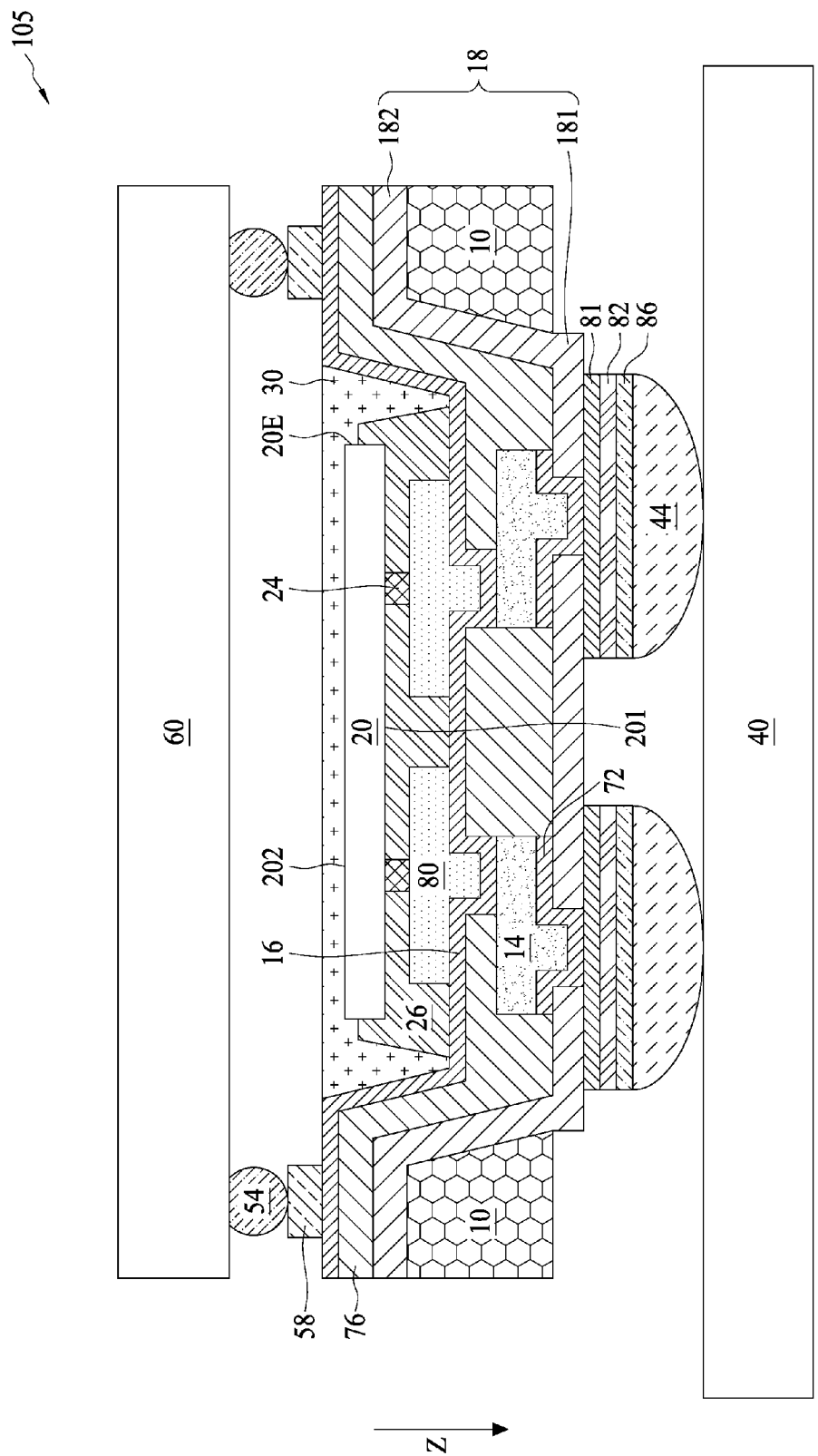
FIG. 16 is a schematic diagram illustrating a semiconductor package structure in accordance with some embodiments of the present disclosure.

FIG. 16 is a schematic diagram illustrating a semiconductor package structure 105 in accordance with some embodiments of the present disclosure. Referring to FIG. 16, the semiconductor package structure 105 includes the second chip 60 facing the second surface 202 of the chip 20. The conductive layer 16 extends toward and overlaps the supporter 10 in the vertical projection direction Z, and the second chip 60 is electrically connected to the chip 20 through the conductive layer 16. The encapsulant 30 exposes the conductive layer 16 over the supporter 10. In one or more embodiments, the semiconductor package structure 105 further includes one or more bonding pads 58 and the fourth conductors 54. The bonding pads 58 are formed on and electrically connected to the conductive layer 16 over the supporter 10. The fourth conductors 54 are formed on the bonding pads 58. The fourth conductors 54 may be, but are not limited to, solder bumps. The second chip 60 is electrically connected to the conductive layer 16 through the fourth conductors 54 and the bonding pads 58.

Figure 17:
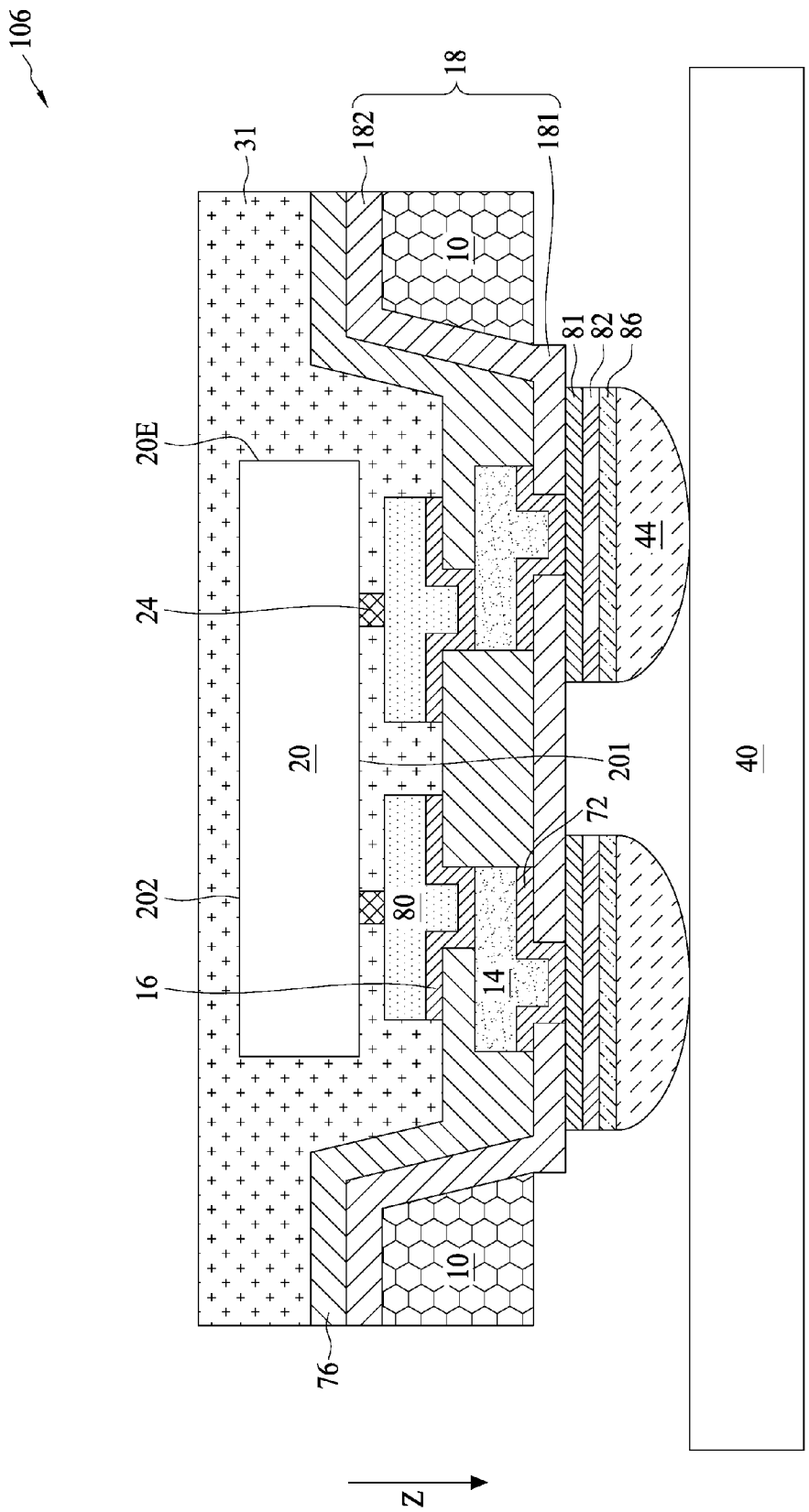
FIG. 17 is a schematic diagram illustrating a semiconductor package structure in accordance with some embodiments of the present disclosure.

FIG. 17 is a schematic diagram illustrating a semiconductor package structure 106 in accordance with some embodiments of the present disclosure. Referring to FIG. 17, the semiconductor package structure 106 includes the MUF layer 31 covering the chip 20 and filling between the chip 20 and the conductive layer 16. The MUF layer 31 may be formed by molding, gel dispensing or other methods.

In conclusion, the semiconductor package structure of the present disclosure uses a supporter (also referred to as a stiffener) in conjunction with an encapsulant to enhance a structural robustness, and thus no carrier or interposer is used. Accordingly, a thickness of the semiconductor package structure is reduced, and warpage of the semiconductor package structure is alleviated. In addition, the RDL or the encapsulant is partially fixed on the supporter, and thus surface wrinkling is mitigated.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, substantially parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first chip having a first surface and a second surface opposite the first surface;
   a supporter surrounding an edge of the first chip, wherein the supporter includes a recessed portion;
   a conductive layer disposed over the first surface of the first chip and electrically connected to the first chip;
   an insulation layer disposed over the first surface of the first chip, wherein the insulation layer extends toward and overlaps the supporter in a vertical projection direction; and
   an encapsulant between the first chip and the supporter and surrounding at least the edge of the first chip.

2. The semiconductor package structure of claim 1, wherein (i) the encapsulant covers the second surface of the first chip and the supporter, (ii) the encapsulant exposes the second surface of the first chip and covers the supporter, or (iii) the encapsulant exposes the second surface of the first chip and the supporter.

3. The semiconductor package structure of claim 1, further comprising a first conductor between the first surface of the first chip and the conductive layer, wherein the first chip and the conductive layer are electrically connected through the first conductor.

4. The semiconductor package structure of claim 1, further comprising:
   a package substrate; and
   a second conductor between the insulation layer and the package substrate, wherein the conductive layer and the package substrate are electrically connected through the second conductor.

5. The semiconductor package structure of claim 4, further comprising:
   a circuit board; and a third conductor between the package substrate and the circuit board, wherein the package substrate and the circuit board are electrically connected through the third conductor.

6. The semiconductor package structure of claim 1, wherein the supporter includes a first segment and a second segment connected to the first segment, the second segment comprises the recessed portion, and a thickness of the second segment is smaller than a thickness of the first segment.

7. The semiconductor package structure of claim 1, wherein the conductive layer is a redistribution layer (RDL) in the insulation layer.

8. The semiconductor package structure of claim 1, further comprising a second chip facing the second surface of the first chip and electrically connected to the first chip through the conductive layer.

9. A semiconductor package structure, comprising:
   a first chip having a first surface and a second surface opposite the first surface;
   a supporter surrounding an edge of the first chip, wherein the supporter includes a recessed portion;
   a conductive layer disposed over the first surface of the first chip and electrically connected to the first chip;
   an insulation layer disposed over the conductive layer, wherein the insulation layer includes a first portion and a second portion connected to the first portion, the first portion overlaps the first chip in a vertical projection direction, the second portion overlaps the supporter in the vertical projection direction, and the first portion and the second portion are disposed at different horizontal levels; and
   an encapsulant between the first chip and the supporter and surrounding at least the edge of the first chip.

10. The semiconductor package structure of claim 9, further comprising a first conductor between the first surface of the first chip and the conductive layer, wherein the first chip and the conductive layer are electrically connected through the first conductor.

11. The semiconductor package structure of claim 9, further comprising:
    a redistribution layer (RDL) in the insulation layer and electrically connected to the first chip through the conductive layer;
    a package substrate; and
    a second conductor between the insulation layer and the package substrate, wherein the RDL and the package substrate are electrically connected through the second conductor.

12. The semiconductor package structure of claim 9, wherein (i) the encapsulant covers the second surface of the first chip and the supporter, (ii) the encapsulant exposes the second surface of the first chip and covers the supporter, or (iii) the encapsulant exposes the second surface of the first chip and the supporter.

13. The semiconductor package structure of claim 9, further comprising a second chip facing the second surface of the first chip, wherein the conductive layer extends toward and overlaps the supporter in the vertical projection direction, and the second chip is electrically connected to the first chip through the conductive layer.

14. A method for manufacturing a semiconductor package structure, the method comprising:
    forming a supporter over a temporary carrier;
    disposing a chip over the temporary carrier, wherein a first surface of the chip faces the temporary carrier;
    forming an encapsulant covering the supporter and a second surface of the chip; and
    removing the temporary carrier from the supporter and the chip.

15. The method for manufacturing the semiconductor package structure of claim 14, further comprising forming a redistribution layer (RDL) in an insulation layer and over the temporary carrier prior to disposing the chip over the temporary carrier.

16. The method for manufacturing the semiconductor package structure of claim 15, wherein the insulation layer includes a first portion and a second portion connected to the first portion, the first portion overlaps the chip in a vertical projection direction, the second portion overlaps the supporter in the vertical projection direction, and the first portion and the second portion are disposed at different horizontal levels.

17. The method for manufacturing the semiconductor package structure of claim 14, further comprising forming a conductive layer disposed over and electrically connected to a redistribution layer (RDL) prior to disposing the chip over the temporary carrier, wherein the conductive layer is at least disposed between the temporary carrier and the chip, and the chip is electrically connected to the conductive layer.

18. The method for manufacturing the semiconductor package structure of claim 17, wherein the conductive layer further extends toward and overlaps the supporter in a vertical projection direction.

19. The method for manufacturing the semiconductor package structure of claim 14, further comprising forming a conductive layer in an insulation layer over the first surface of the chip and the supporter subsequent to removing the temporary carrier from the supporter and the chip.

20. The method for manufacturing the semiconductor package structure of claim 19, wherein the supporter includes a first segment and a second segment connected to the first segment, the second segment has a recessed portion, and a thickness of the second segment is smaller than a thickness of the first segment.

* * * * *